(12) United States Patent
Hashimoto

(10) Patent No.: US 7,362,104 B2
(45) Date of Patent: Apr. 22, 2008

(54) CURRENT MEASUREMENT DEVICE AND TEST DEVICE

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 3 days.

(21) Appl. No.: 11/061,379

(22) Filed: Feb. 18, 2005

(65) Prior Publication Data

US 2006/0071682 A1 Apr. 6, 2006

Related U.S. Application Data

(63) Continuation of application No. PCT/JP2004/006935, filed on May 21, 2004.

(30) Foreign Application Priority Data

May 21, 2003 (JP) ............................. 2003-143726
May 21, 2003 (JP) ............................. 2003-143727
Feb. 26, 2004 (JP) ............................. 2004-051740

(51) Int. Cl.
*G01N 27/416* (2006.01)
(52) U.S. Cl. ...................... 324/426; 320/165
(58) Field of Classification Search ................ 324/426; 320/165, 163, 164
See application file for complete search history.

(56) References Cited

U.S. PATENT DOCUMENTS 5,821,742 A * 10/1998 Carr et al. ..................... 324/74
6,381,156 B1 * 4/2002 Sakai et al. ................... 363/65

FOREIGN PATENT DOCUMENTS

| JP | 7-333249 | 12/1995 |
| JP | 2001-4692 | 1/2001 |
| JP | 2001-4703 | 1/2001 |
| JP | 2001-41997 | 2/2001 |
| JP | 2002-40098 | 2/2002 |

(Continued)

OTHER PUBLICATIONS

International Search Report dated Aug. 17, 2004 (4 pages).

(Continued)

*Primary Examiner*—Bao Q. Vu
*Assistant Examiner*—Aaron Piggush
(74) *Attorney, Agent, or Firm*—Osha Liang LLP

(57) ABSTRACT

A current measuring apparatus for measuring a power supply current received by an electronic device includes: a first current supplying unit for outputting a first current which is a part of the power supply current; a smoothing capacitor for smoothing the first current output by the first current supplying unit connected with one end thereof; a capacitor of device side for smoothing the power supply current, electrostatic capacity of the capacitor of device side being smaller than that of the smoothing capacitor and one end of the capacitor of device side being connected with the electronic device; a switch for making the first current flow from the smoothing capacitor to the capacitor of device side in case of being ON; a second current supplying unit for outputting a second current smaller than the first current to the capacitor of device side via a path parallel to the switch; and a power supply current acquiring unit for acquiring the power supply current on the basis of the second current output by the second current supplying unit.

8 Claims, 15 Drawing Sheets

FOREIGN PATENT DOCUMENTS

WO    WO-2004/104605 A1    2/2004

OTHER PUBLICATIONS

Patent Abstracts of Japan; Publication No. 2001-041997 dated Feb. 16, 2001 (1 page).

Patent Abstracts of Japan; Publication No. 2002-040098 dated Feb. 6, 2002 (1 page).

Patent Abstracts of Japan; Publication No. 2001-004692 dated Jan. 12, 2001 (1 page).

Patent Abstracts of Japan; Publication No. 2001-004703 dated Jan. 12, 2001 (1 page).

Patent Abstracts of Japan; Publication No. 07-333249 dated Dec. 22, 1995 (1 page).

* cited by examiner

CURRENT MEASUREMENT DEVICE AND TEST DEVICE

The present application is a continuation application of PCT/JP2004/006935 filed on May 21, 2004, claiming priority from a Japanese patent application No. 2003-143727 filed on May 21, 2003, No. 2003-143726 filed on May 21, 2003, and No. 2004-051740 filed on Feb. 26, 2004, the contents of which are incorporated herein by reference.

BACKGROUND OF THE INVENTION

1. Field of the Invention

The present invention relates to a current measuring apparatus and a testing method. More particularly, the present invention relates to a current measuring apparatus for measuring a power supply current received by an electronic device.

2. Description of the Related Art

With regard to an electronic device such as a CMOS semiconductor, a power supply current largely varies when an internal circuit operates. Further, conventionally, a voltage generating circuit in which variation in voltage applied to a load is small during an operation characteristics testing of an electronic device is known (for example, see Japanese Patent Application Laid-Open No. 1995-333249 (pages 2 to 4 and FIGS. 1 to 5)).

As a technique for micronizing an electronic device is improved, an operation speed is increased, an operation voltage is decreased, and an allowable range of variation in power supply voltage is lowered. Thus, a testing apparatus for testing the electronic device requires a power supply apparatus of higher accuracy.

SUMMARY OF THE INVENTION

Therefore, it is an object of the present invention to provide a current measuring apparatus and a testing apparatus, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a current measuring apparatus for measuring a power supply current received by an electronic device includes: a first current supplying unit for outputting a first current which is a part of the power supply current; a smoothing capacitor for smoothing the first current output by the first current supplying unit connected with one end thereof; a capacitor of device side for smoothing the power supply current, electrostatic capacity of the capacitor of device side being smaller than that of the smoothing capacitor and one end of the capacitor of device side being connected with the electronic device; a switch for making the first current flow from the smoothing capacitor to the capacitor of device side in case of being ON; a second current supplying unit for outputting a second current smaller than the first current to the capacitor of device side via a path parallel to the switch; and a power supply current acquiring unit for acquiring the power supply current on the basis of the second current output by the second current supplying unit.

Further, the current measuring apparatus may further include a first resistor for electrically connecting the switch and one end of the capacitor of device, and a second resistor having electric resistance larger than that of the first resistor for electrically connecting the second current supplying unit and one end of the capacitor of device. Further, the power supply current acquiring unit may acquire the power supply current on the basis of a ratio of the electric resistance of the first resistor to the electric resistance of the second resistor and the output second current in case the switch becomes ON.

Further, the power supply current acquiring unit may acquire the second current as the power supply current in case the switch becomes OFF.

Further, the switch may include a MOS transistor for electrically connecting the smoothing capacitor and the capacitor of device side in case of being ON; and a gate resistor of which one end is electrically connected to a gate terminal of the MOS transistor and the other end receives a control signal for controlling the MOS transistor.

According to the second aspect of the present invention, a current measuring apparatus for measuring a power supply current received by an electronic device includes: a first current supplying unit for outputting a first current which is a part of the power supply current; a smoothing capacitor for smoothing the first current output by the first current supplying unit connected with one end thereof; a capacitor of device side for smoothing the power supply current, electrostatic capacity of the capacitor of device side being smaller than that of the smoothing capacitor and one end of the capacitor of device side being connected with the electronic device; a first resistor for electrically connecting one end of the smoothing capacitor and one end of the capacitor of device side; a second resistor which has electric resistance larger than that of the first resistor and of which one end is electrically connected with one end of the capacitor of device; a second current supplying unit for outputting a second current smaller than the first current to the capacitor of device side via the second resistor; and a power supply current acquiring unit for acquiring the power supply current on the basis a ratio of electric resistance of the first resistor to electric resistance of the second resistor and the second current output by the second current supplying unit.

According to the third aspect of the present invention, a testing apparatus for testing an electronic device includes: a first current supplying unit for outputting a first current which is a part of a power supply current to be received by the electronic device; a smoothing capacitor for smoothing the first current output by the first current supplying unit connected with one end thereof; a capacitor of device side for smoothing the power supply current, electrostatic capacity of the capacitor of device side being smaller than that of the smoothing capacitor and one end of the capacitor of device side being connected with the electronic device; a switch for making the first current flow from the smoothing capacitor to the capacitor of device side in case of being ON; a second current supplying unit for outputting a second current smaller than the first current to the capacitor of device side via a path parallel to the switch; and a determining unit for acquiring the power supply current on the basis of the second current output by the second current supplying unit and determining pass/fail of the electronic device on the basis of the acquired power supply current.

According to the fourth aspect of the present invention, a testing apparatus for testing an electronic device includes: a first current supplying unit for outputting a first current which is a part of a power supply current to be received by the electronic device; a smoothing capacitor for smoothing the first current output by the first current supplying unit connected with one end thereof; a capacitor of device side for smoothing the power supply current, electrostatic capacity of the capacitor of device side being smaller than that of the smoothing capacitor and one end of the capacitor of device side being connected with the electronic device; a first resistor for electrically connecting one end of the smoothing capacitor and one end of the capacitor of device side; a second resistor which has electric resistance larger than that of the first resistor and of which one end is electrically connected with one end of the capacitor of device; a second current supplying unit for outputting a second current smaller than the first current to the capacitor of device side via the second resistor; and a determining unit for acquiring the power supply current on the basis of a ratio of electric resistance of the first resistor to electric resistance of the second resistor and the second current output by the second current supplying unit and determining pass/fail of the electronic device on the basis of the acquired power supply current.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
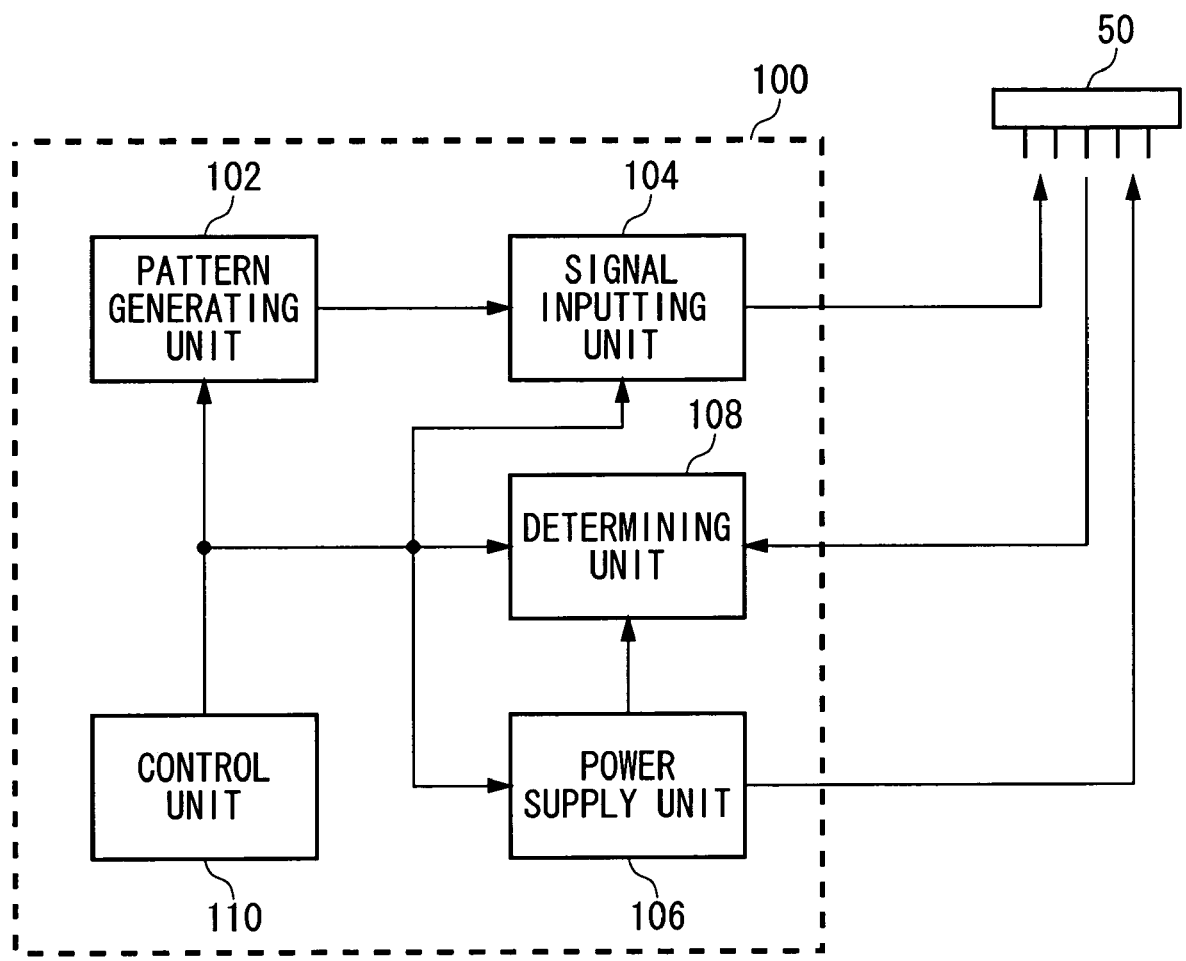
FIG. 1 shows an example of the configuration of a testing apparatus 100 according to an embodiment of the present invention.

FIG. 1 shows an example of the configuration of a testing apparatus 100 according to an embodiment of the present invention along with an electronic device 50. The electronic device 50 is a device under test ("DUT") such as an LSI. It is an object of the testing apparatus 100 according to the present example to perform a testing on the electronic device 50 with high accuracy. The testing apparatus 100 includes a control unit 110, a power supply unit 106, a pattern generating unit 102, a signal inputting unit 104, and a determining unit 108. The control unit 110 controls the power supply unit 106, the pattern generating unit 102, the signal inputting unit 104, and the determining unit 108.

The power supply unit 106 is a power supply apparatus for providing the electronic device 50 with a power supply current. Further, the power supply unit 106 according to the present example measures the size of the power supply current and informs the determining unit 108 of the result of the measurement.

The pattern generating unit 102 generates a test pattern which should be input to the electronic device 50 and provides the signal inputting unit 104 with the test pattern. The signal inputting unit 104 provides the electronic device 50, which receives the power supply current from the power supply unit 106, with the test pattern at a predetermined timing, for example, by delaying the test pattern by a predetermined time.

The determining unit 108 determines pass/fail of the electronic device 50 on the basis of a signal output by the electronic device 50 in response to the test pattern. Further, the determining unit 108 according to the present example determines pass/fail of the electronic device 50 on the basis of the size of the power supply current applied to the electronic device 50 by the power supply unit 106. The determining unit 108 may have a function of a power supply current acquiring unit for acquiring the power supply current. According to the present example, it is possible to perform properly a testing on the electronic device 50. The testing apparatus 100 may have a function of a current measuring apparatus for measuring the power supply current received by the electronic device 50.

Figure 2:
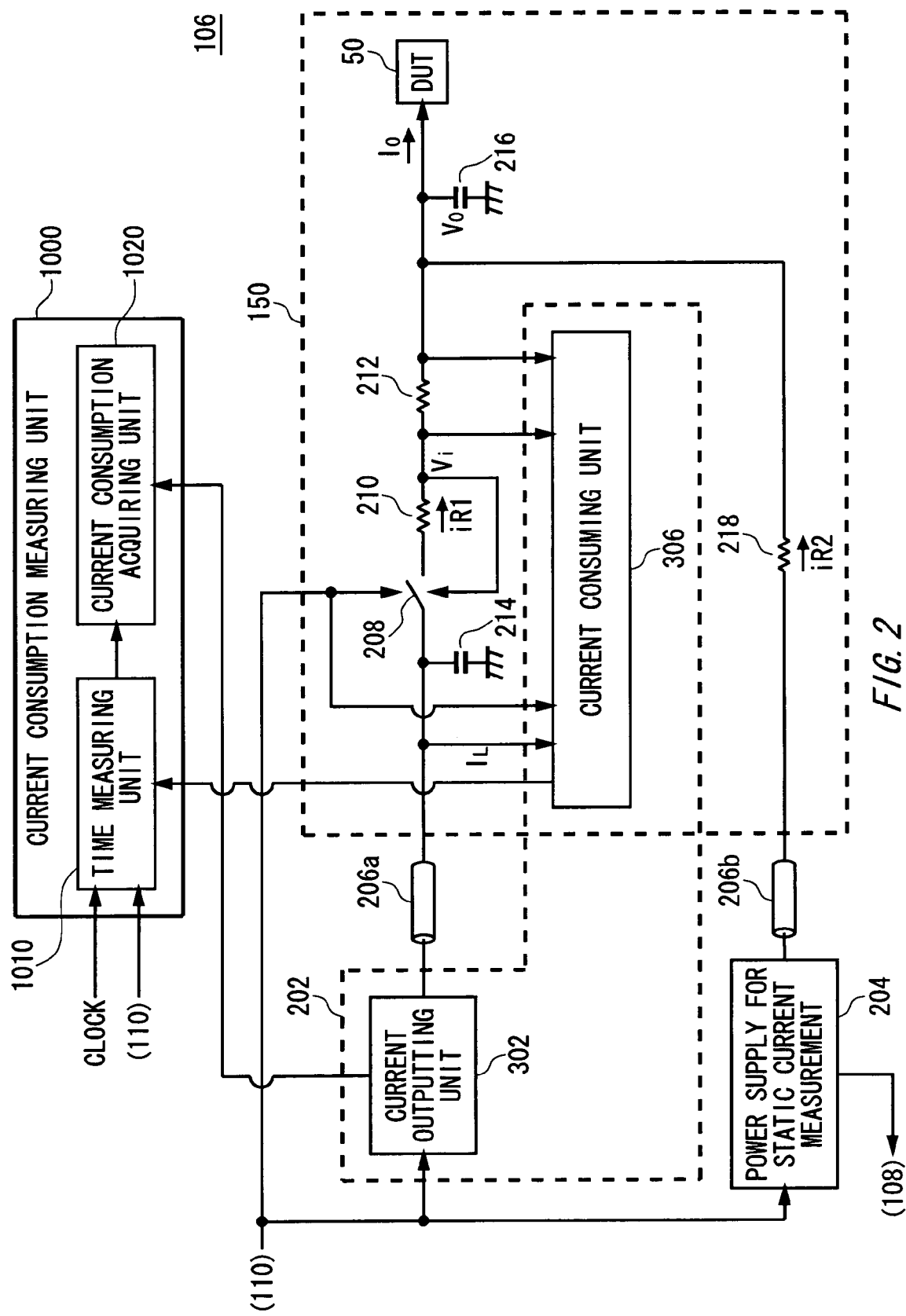
FIG. 2 shows an example of the configuration of a power supply unit 106.

FIG. 2 shows an example of the configuration of the power supply unit 106 along with the electronic device 50. The power supply unit 106 includes a power supply for large current 202, a power supply for static current measurement 204, a plurality of connecting lines 206a and 206b, a plurality of capacitors 214 and 216, a switch 208, and a plurality of resistors 210, 212, and 218. Further, according to the present example, the electronic device 50 receives a terminal voltage Vo of the capacitor 216 as the power supply current.

According to the present example, a current consuming unit 306, the plurality of capacitors 214 and 216, the switch 208, and the plurality of resistors 210, 212, and 218, which are apart of the power supply for large current 202, are provided on a user interface 150. The user interface 150 is an example of a printed circuit substrate on which a wiring electrically connecting the current outputting unit 302 and the electronic device 50 is formed and, for example, a performance board on which the electronic device 50 is mounted. Further, the testing apparatus 100 may test the electronic device 50 which is in a wafer state. In this case, the electronic device 50 is connected with the user interface 150, for example, via a probe card.

The power supply for large current 202 is an example of a first current supplying unit and includes the current outputting unit 302 and the current consuming unit 306. The current outputting unit 302 is a device power supply for supplying an electric power to the electronic device 50 and applies a first current iR1 which is at least a part of an output current to the electronic device 50 via the connecting line 206a, the switch 208, the resistor 210, and the resistor 212, for example, by outputting a voltage on the basis of an instruction of the control unit 110. According to the present example, the first current iR1 is a part of a power supply current $I_o$ which should be received by the electronic device 50.

The current consuming unit 306 is an example of a power supply voltage stabilizing apparatus and stabilizes the power supply voltage which the power supply unit 106 supplies to the electronic device 50. In order to stabilize the power supply voltage, the current consuming unit 306 consumes a partial current IL which is a part of the output current of the current outputting unit 302 in response to an instruction of the control unit 110 by making the partial current IL flow through a path parallel to the electronic device 50. In this case, the power supply for large current 202 provides the output current from which the partial current IL is subtracted to the electronic device 50 by the first current iR1.

Further, the current consuming unit 306 detects whether or not the terminal voltage Vo of the capacitor 216 is reduced on the basis of the voltage generated by the resistor 212. Then, in case of detecting that the terminal voltage Vo is reduced, the current consuming unit 306 stops consuming the partial current IL. In this case, the power supply for large current 202 provides the electronic device 50 with the whole part of the output current as the first current iR1 and thus increases the first current iR1. By this, the power supply for large current 202 raises the terminal voltage $V_o$. Therefore, according to the present example, it is possible to hold the terminal voltage Vo of the capacitor 216 stably. Further, it is possible to test the electronic device receiving the terminal voltage Vo as the power supply voltage with high accuracy.

The power supply for static current measurement 204 is an example for a second current supplying unit and supplies a second current iR2 less than the first current iR1 to the electronic device 50 via the resistor 218 provided on a path parallel to the switch 208. Further, according to the present example, the power supply for static current measurement 204 informs the determining unit 108 of the size of the output second current iR2.

The plurality of connecting lines 206a and 206b are, for example, coaxial cables and electrically connect the current outputting unit 302 and the power supply for static current measurement 204 with the user interface 150. According to the present example, the connecting line 206a electrically connects the current outputting unit 302 with the switch 208. The connecting line 206b electrically connects the power supply for static current measurement 204 with the resistor 218.

The capacitor 214 is an example of a smoothing capacitor. One end of the capacitor 214 is connected with the current outputting unit 302 via the connecting line 206a and the other end is grounded. Further, one end of the capacitor 216 is electrically connected with the capacitor 214 via the resistor 212, the resistor 210, and the switch 208. Thus, the capacitor 216 smoothes the first current iR1 downstream in the current direction from the resistor 212. The capacitor 216 may smooth the power supply current $I_o$ applied to the electronic device 50 by the resistor 212.

The switch 208 is provided between the capacitor 214 and the resistor 210 in series with the resistor 212. In case of being ON, the switch 208 makes the first current iR1 flow from the capacitor 214 to the capacitor 216 via the resistors 210 and 212. According to the present example, the switch 208 becomes ON or OFF according to an instruction of the control unit 110. Further, in case the voltages of both ends of the resistor 210 are larger than a predetermined value, the switch 208 makes the first current iR1 flow regardless of the instruction of the control unit. In this case, it is possible to prevent the terminal voltage Vo of the capacitor 216 from being excessively reduced.

The resistor 210 is an example of a first resistor and is connected with the switch 208 in series. Thus, the resistor 210 limits the output current of the power supply for large current 202 and outputs the first current iR1 to the power supply for large current 202. Further, the resistor 210 is electrically connected with the capacitor 216 via the resistor 212 and thus electrically connects the switch 208 and one end of the capacitor 216. Further, in case the resistor 210 electrically connects one end of the capacitor 214 with one end of the capacitor 216 and the switch 208 becomes ON, the resistor 210 makes the first current iR1 flow from the capacitor 214 to the capacitor 216.

The resistor 212 is an example of a connecting resistor and provided between the resistor 210 and the electronic device 50 in series with the resistor 210. Thus, the resistor 212 electrically connects the current outputting unit 302 and the electronic device 50 and provides the electronic device 50 with the first current iR1 received from the switch 208 via the resistor 208. The resistor 212 may provide the electronic device 50 with the first current iR1 received from the current outputting unit 302 as at least a part of the power supply current $I_o$.

Further, the resistor 212 applies a voltage generated across the resistor 212 in response to the first current to the current consuming unit 306. In this case, the resistor 212 is used to detect not an absolute value of flowing current but reduction of the terminal voltage Vo of the capacitor 216. Thus, the resistor 212 may be a pattern resistor formed on the user interface 150. For example, 5 mA is enough for electric resistance of the resistor 212. In addition, for example, copper of the wire may be 35 μm in thickness, the width and length of the pattern may be 10 mm and 10 cm, respectively.

The resistor 218 is an example of a second resistor. One end of the resistor 218 is electrically connected with an end of the condenser 216 and the other end is electrically connected with the power supply for static current measurement 204 via the connecting line 206b. By this, the resistor 218 electrically connects the power supply for static current measurement 204 and one end of the capacitor 216. Further, the resistance 218 has larger electric resistance than the resistance 210. Thus, the resistance 218 makes the power supply for static current measurement 204 output the second current iR2 which is less than the first current iR1. According to the present example, it is possible to provide properly the electronic device 50 with the power supply current $I_o$.

In the following, operation of the power supply unit 106 and the determining unit 108 is described in detail. According to the present example, the switch 208 becomes ON, for example, in case an operation testing is conducted on the electronic device 50. In this case, the power supply unit 106 provides the electronic device 50 with the sum of the first and the second currents iR1 and iR2 as the power supply current $I_o$.

In this case, the power supply for large current 202 and the power supply for static current measurement 204 apply the first and the second currents iR1 and iR2 according to a ratio of electronic resistance of the resistors 210 and 218 to the electronic device 50. The determining unit 108 may acquire the size of the first current iR1 on the basis of the size of the second current iR2 of which the power supply for static current measurement 204 informs and the ratio of electric resistance. By this, in case the switch becomes ON, the determining unit 108 acquires the power supply current $I_o$ received by the electronic device 50 on the basis of the ratio of electronic resistance of the resistors 210 and 218 and the second current iR2 output by the power supply for static current measurement 204. The determining unit 108 may acquire the power supply current $I_o$ received by the electronic device 50 during the operation testing.

Here, there is sometimes an error due to influence of an electrostatic capacitance of the capacitor 214 in case the size of the first current iR1 is acquired on the basis of the current output by the power supply for large current 202. However, according to the present example, the power supply for static current measurement 204 provides the electronic device 50 with the second current iR2 without passing through the capacitor 214 having a large electrostatic capacitance. Thus, the power supply for static current measurement 204 detects the output second current iR2 with high accuracy and informs the determining unit 108 of the result. Therefore, according to the present example, it is possible to detect the power supply current $I_o$ of the electronic device 50 with high accuracy.

Further, the switch 208 becomes OFF, for example, in case a static current testing (Iddq testing) is conducted on the electronic device 50. In this case, the power supply unit 106 provides the electronic device 50 with the second current iR2 as the power supply current $I_o$. By this, in case the switch 208 becomes OFF, the determining unit 108 acquires the second current iR2 output by the power supply for static current measurement 204 as the power supply current $I_o$ received by the electronic device 50. Thus, the determining unit 108 acquires the power supply current $I_o$ on the basis of the second current iR2 output by the power supply for static current measurement 204. Further, the determining unit 108 may determine pass/fail of the electronic device 50 on the basis of the acquired power supply current $I_o$. According to the present example, it is possible to perform the testing of the electronic device 50 with high accuracy.

In addition, when one capacitor is used instead of the capacitors 214 and 216 as a capacitor for smoothing the power supply current $I_o$, variation in the terminal current of the capacitor following variation in the power supply current $I_o$ becomes larger and the power supply voltage of the electronic device 50 becomes unstable in case the capacity of the capacitor is small. Further, in case the capacity of the capacitor is large, sometimes it takes much time for the terminal voltage which is subject to variation to restore the original state and it is difficult to hold properly the power supply voltage of the electronic device 50.

However, according to the present example, by providing the capacitor 216 for smoothing the power supply current $I_o$ near the electronic device 50 and the capacitor 214 for smoothing the large first current iR1 in case conducting a function test, it is possible to reduce the variation in the power supply voltage according to the variation in the power supply current $I_o$, for example, when the function test is conducted. Further, in case of conducting static current measurement and the like, it is possible to measure the power supply current $I_o$ with high accuracy, for example, by making the switch 208 OFF.

Here, for example, in case letting the power supply voltage of the electronic device 50 be 2V and an allowable range of variation in power supply voltage be five percent (5%), the variation in the power supply voltage is required to be substantially less than 50 mV further in consideration of tolerance of 0.5. In this case, if a function rate, a peak current, a period during which the peak current flows, and a response time required for the power supply for large current 202 to vary the output current are ten (10) nanosecond, one ampere (1 A), four (4) nanosecond, and five (5) µ second, respectively, an electrostatic capacity of the capacity may be, for example, (0.4A×5 µsec)/50 mV=40 µF. Further, the capacitor 216 may have the electrostatic capacity substantially less than one-tenth of that of the capacitor 214 according to the ratio of the first and the second currents iR1 and iR2.

Further, the power supply for large current 202 may output the first current iR1 which is inversely proportional to the sum of the ON-state resistance of the switch 208 and the electric resistance of the resistor 210. The power supply for static current measurement 204 may output the second current iR2 which is inversely proportional to the electric resistance of the resistor 218.

A ratio of the sum of the ON-state resistance of the switch 208 and the electric resistance of the resistor 210 to the electric resistance of the resistor 218 is predetermined according to a range of the power supply current $I_o$ to be measured. The sum of the ON-state resistance of the switch 208 and the electric resistance of the resistor 210 may be, for example, substantially larger than one-tenth of the electric resistance of the resistance 218. In this case, the power supply for static current measurement 204 outputs the second current iR2 substantially less than one-tenth of the first current iR1. In case the maximum value of the power supply current $I_o$ is substantially 10 mA when a static current testing is conducted, the electric resistance of the resistor 218 may be, for example, substantially 50 mV/10 mA=5 Ω in order to make variation in voltage substantially 50 mV when the stitch is switched from ON to OFF.

Further, the power supply unit 106 may further include a current consumption measuring unit 1000 for measuring the power supply current $I_o$ which is supplied to the electronic device 50 and consumed by the electronic device 50 during the function test of the electronic device 50. Here, in case the current consumption measuring unit 1000 measures the power supply current $I_o$ consumed by the electronic device 50, the control unit 110 stops the power supply for static current measurement 204 from outputting the second current iR2.

The power supply unit 106 according to the present embodiment acquires an average current consumption of the electronic device 50 during measuring time, for example, on the basis of the value of the output current of the current outputting unit 302 during a predetermined measuring time of the function test. Here, the power supply unit 106 may acquire the average current consumption of the electronic device 50 further on the basis of a value of the partial current IL during the measuring time.

The current consumption measuring unit 1000 includes a time measuring unit 1010 and a current consumption acquiring unit 1020. The time measuring unit 1010 measures time during which the current consuming unit 306 consumes the partial current IL or stops the consumption of the time for measuring the average current consumption of the electronic device 50. The current consumption acquiring unit 1020 acquires and displays the average current consumption of the electronic device 50 during the measuring time on the basis of the time during which the current consuming unit 306 consumes the partial current IL or stops the consumption and which is measured by the time measuring unit 1010 and a current value of the output current of the current outputting unit 302. Further, the current consumptionacquiring unit 1020 displays a ratio of the time during which the current consuming unit 306 consumes the partial current IL or stops the consumption to the measuring time.

Figure 3:
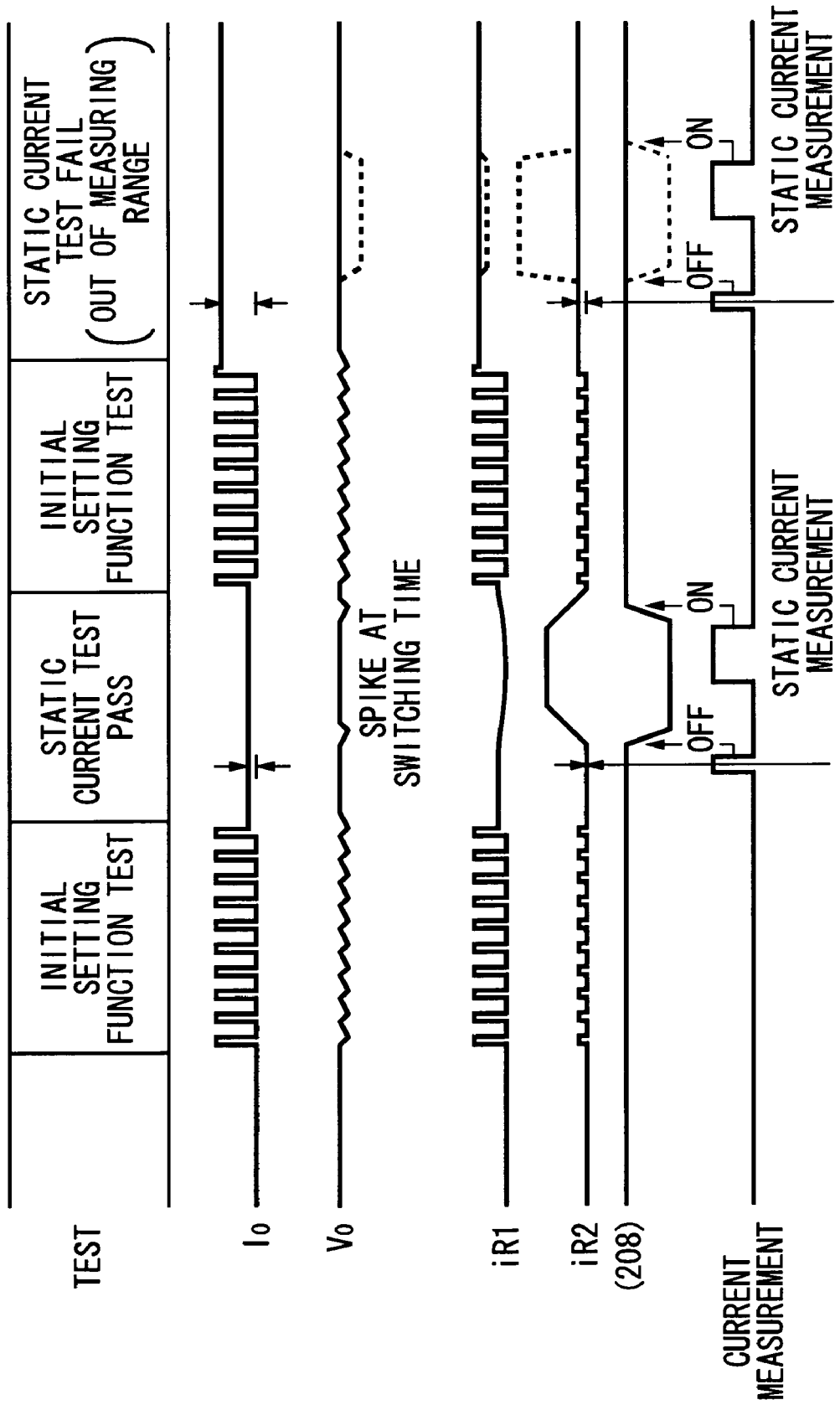
FIG. 3 is a timing chart showing an example of an operation of the testing apparatus 100.

FIG. 3 is a timing chart showing an example of an operation of the testing apparatus 100. According to the present example, the testing apparatus 100 conducts an initial setting and/or function testing and a static current testing. By this, the testing apparatus 100 measures a static current after the large power supply current $I_o$ flows through the electronic device 50. Further, the testing apparatus 100 conducts the initial setting and/or function testing and the static current testing again after the static current testing.

In case the initial setting and/or function testing is conducted, the switch 208 is ON and the electronic device 50 receives the first current iR1 and the second current iR2 which is substantially one-tenth of the first current iR1 as the power supply current $I_o$. Further, the electronic device 50 receives the power supply current $I_o$, for example, which varies synchronously with a clock signal. In this case, the terminal voltage Vo of the capacitor 216 increases and decreases with the power supply current $I_o$ with negative correlation synchronously with the power supply current $I_o$.

Further, in case the static current measurement is conducted, the determining unit 108 measures the power supply current $I_o$ before the switch is switched. Then, if the power supply current $I_o$ is within a predetermined range (pass), the control unit 110 makes the switch 208 OFF and thus cuts off the first current iR1. In this case, the electronic device 50 receives the second current iR2 as the power supply current $I_o$. Then, after the determining unit 108 measures the power supply current $I_o$ of the electronic device 50, the control unit 110 makes the switch 208 ON again. By this, the testing apparatus 100 finishes the static current testing.

Then, the testing apparatus 100 conducts the initial setting and/or function testing again and starts the next static current testing. In this case, the control unit 110 also measures the power supply current $I_o$ before the control unit makes the switch ON. Here, in case the power supply current $I_o$ is out of a predetermined range (fail), for example, the power supply current $I_o$ is larger than a predetermined value, the control unit 110 holds ON-state of the switch 208 and the electronic device 50 receives the first and the second currents iR1 and iR2 successively as the power supply current $I_o$. Thus, it is possible to properly perform the static current testing also in case the static current of the electronic device 50 is larger than current supplying ability of the power supply for static current measurement 204.

In addition, according to another example, the switch 208 may be OFF as shown by a dotted line in the figure without performing previously the measurement of the power supply current $I_o$. In this case, if the power supply current $I_o$ is fail, the voltage across the resistance 210 increases in response to reduction of the terminal voltage Vo of the capacitor 216. Thus, the switch 208 makes the first current iR1 flow regardless of the instruction of the control unit. In this case, it is also possible to properly provide the electronic device 50 with the power supply current $I_o$.

Figure 4:
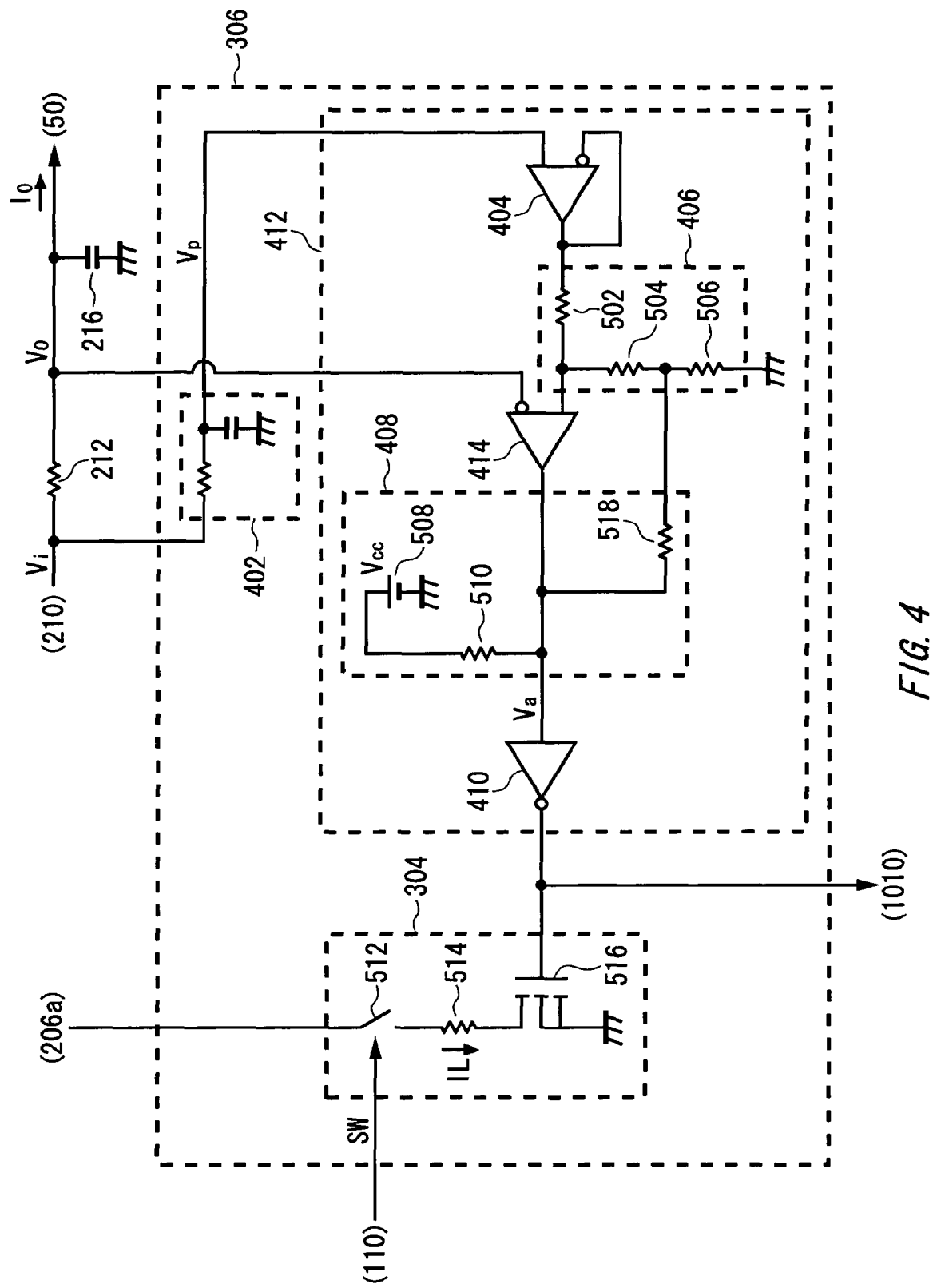
FIG. 4 shows an example of the configuration of a current consuming unit 306 in detail.

FIG. 4 shows an example of the configuration of the current consuming unit 306 in detail. According to the present example, the consuming unit 306 includes a low-pass filter 402, a difference detecting unit 412, and a parallel load unit 304. The low-pass filter 402, the difference detecting unit 412, and the parallel load unit 304 may be provided on the user interface 150 (see FIG. 2).

The low-pass filter 402 includes a resistor and a capacitor. The resistor is connected with an end of the resistor 212 of the power supply side and an end of the capacitor. Further, the other end of the capacitor is grounded. By this, the low-pass filter 402 receives the output current of the current outputting unit 302 (see FIG. 2), reduces high frequency components of the output current, and provides the difference detecting unit 412 with it.

Further, it is preferable that the low-pass filter 402 has a cut-off frequency lower than a frequency at which the power supply current $I_o$ received by the electronic device 50 varies. In this case, the low-pass filter 402 reduces frequency components having frequency higher than the cut-off frequency and passes the output voltage of the current outputting unit 302. Further, according to the present example, the low-pass filter 402 receives a voltage Vi of the end of the power supply side of the resistance 212 as the output voltage of the current outputting unit 302 and applies a voltage Vp which is obtained by reducing high frequency components of the voltage Vi to the difference detecting unit 412.

The difference detecting unit 412 includes a voltage follower 404, a reference voltage outputting unit 406, a comparing unit 414, a reference voltage setting unit 408, and a load driving unit 410. The voltage follower 404 is an operational amplifier of which output is subject to negative feedback. The voltage follower 404 receives an output voltage of the low-pass filter 402 as a positive input and applies a voltage equal to the output voltage to the reference voltage outputting unit 406.

The reference voltage outputting unit 406 includes a plurality of resistors 502, 504, and 506 connected in series between the output of the voltage follower 404 and the ground potential. The reference voltage outputting unit 406 outputs potential of a node between the resistors 502 and 504 as a reference voltage applied to the comparing unit 414. By this, the reference voltage outputting unit 406 outputs a reference voltage which is obtained by dividing the output voltage of the low-pass filter 402 on the basis of electric resistance of the plurality of resistors 502, 504, and 506.

Further, the reference voltage outputting unit 406 receives the output of the reference voltage setting unit 408 from a node between the resistors 504 and 506. Thus, the reference voltage outputting unit 406 outputs a first reference voltage or a second reference voltage according to the output of the reference voltage setting unit 408.

The comparing unit 414 receives the reference voltage output by the reference voltage outputting unit 406 as a positive input and a potential of an end of device side of the resistor 212 which is near the device 50 as a negative input. Thus, the comparing unit 414 compares the reference voltage with the potential of the end of device side. The difference detecting unit 412 may receive the output voltage of the low-pass filter 402 via the voltage follower 404 and the reference voltage outputting unit 406 and thus detect a difference between the output voltage of the low-pass filter 402 and the potential of the end of device side of the resistor 212. Then, the comparing unit 414 applies the comparison result to the reference voltage setting unit 408, for example, by a collector open output. For example, the comparing unit 414 makes the output ON in case a potential of the positive input is higher than that of the negative input and makes the output grounded in case the potential of the positive input is lower than that of the negative input.

In addition, the end of device side of the resistor 212 is connected with one end of the capacitor 216. By this, the potential of the end of device side is equal to the terminal voltage Vo of the capacitor 216. The comparing unit 414 may compare the output voltage of the low-pass filter 402 with the terminal voltage $V_o$.

The reference voltage setting unit 408 includes a constant voltage source 508 and a plurality of resistors 510 and 518. The constant voltage source 508 outputs a predetermined voltage Vcc. The resistor 510 connects a positive electrode of the constant voltage source 508 and an output end of the comparing unit 414. The resistor 518 connects the output end of the comparing unit 414 and an upstream end of the resistor 506 of the reference voltage outputting unit 406.

Thus, since the comparing unit 414 makes its output ON in case the terminal voltage Vo is lower than the reference voltage, the reference voltage setting unit 408 applies the output voltage Vcc of the constant voltage source 508 to the upstream end of the resistor 506 via the plurality of resistors 510 and 518. In this case, the reference voltage outputting unit 406 outputs the first reference voltage on the basis of ratios of electric resistance of the plurality of resistors 502, 504, 506, 510, and 518 and the output voltage Vcc of the constant voltage source 508.

Further, since the comparing unit 414 makes its output grounded in case the terminal voltage Vo is higher than the reference voltage, the reference voltage setting unit 408 makes the upstream end of the resistor 506 grounded via the resistor 518. In this case, since a potential of the upstream end of the resistor 506 is lowered, the reference voltage outputting unit 406 outputs the second reference voltage lower than the first reference voltage on the basis of the output of the voltage follower 404 and the ratios of electric resistance of the plurality of resistors 502, 504, 506, 510, and 518.

Thus, the reference voltage setting unit 408 makes the reference voltage outputting unit 406 output the second reference voltage in case the terminal voltage Vo of the capacitor 216 is higher than the first reference voltage on the basis of the output of the comparing unit 414. Further, in case the terminal voltage Vo is lower than the second reference voltage, the reference voltage setting unit 408 makes the reference voltage outputting unit 406 output the first reference voltage. The reference voltage outputting unit 406 outputs a reference voltage which varies with hysteresis on the basis of the output of the reference voltage setting unit 408.

Further, the reference voltage setting unit 408 applies a potential Va of a node between the resistors 501 and 518 to the load driving unit 410. By this, in case the terminal voltage Vo of the capacitor 216 is lower than the reference voltage output by the reference voltage outputting unit 406, the reference voltage setting unit 408 applies a H-signal to the load driving unit 410 according to the output of the comparing unit 414. Further, in case the terminal voltage Vo is higher than the reference voltage, the reference voltage setting unit 408 applies an L-signal to the load driving unit 410. Thus, the reference voltage setting unit 408 applied the output of the comparing unit 414 to the load driving unit 410.

The load driving unit 410 is, for example, an inverting circuit, inverts the output of the comparing unit 414 received via the reference voltage setting unit 408 and applies it to the parallel load unit 304. Thus, the load driving unit 410 applies a signal according to the result of comparing the terminal voltage Vo of the capacitor 216 with the reference voltage to the parallel load unit 304. According to the present example, in case the terminal voltage Vo is higher than the reference voltage, the load driving unit 410 outputs the H-signal. Further, in case the terminal voltage Vo is lower than the reference voltage, the load driving unit 410 outputs the L-signal. Thus, the difference detecting unit 412 informs the parallel load unit 304 of the result of detecting a potential difference between the output voltage of the low-pass filter 402 and the terminal voltage Vo of the capacitor 216.

Further, the output of the load driving unit 410 is provided to the time measuring unit 1010. The load driving unit 410 measures time during which the current consuming unit 306 consumes the partial current IL or stop the consumption on the basis of the signal output by the load driving unit 410.

The parallel load unit 304 includes a low-speed switch 512, a resistor 514, and a high-speed switch 516. The low-speed switch 512 is a switch for opening and closing at a speed than a response speed of the current outputting unit 302 and is connected with the resistor 212 in parallel with one end connected with the connecting line 206a. Thus, the parallel load unit 304 is connected with the resistor 212 in parallel with respect to an output end of the 302. Further, the low-speed switch 512 opens and closes, for example, in response to an instruction of the control unit 110. Here, the response speed of the current outputting unit 302 is a speed at which the current outputting unit 302 varies the output current according to variation in the power supply current $I_o$ received by the electronic device 50, for example. The low-speed switch 512 may be a semiconductor switch such as a MOSFET. In this case, the low-speed switch 512 may receive an output SW of the control unit 110, for example, via a resistor.

The resistor 514 is connected with the low-speed switch 512 in series downstream of the low-speed switch 512. Thus, the resistor 514 consumes a current received from the current outputting unit 302 via the high-speed switch 516.

The high-speed switch 516 is an N-type MOSFET which is connected with the resistor 514 in series downstream of the resistor 514 and receives the output of the load driving unit 410 from a gate terminal. Thus, the high-speed switch 516 opens and closes according to the output of the difference detecting unit 412. Further, the high-speed switch 516 opens and closes at a speed higher than the response speed of the current outputting unit 302. The high-speed switch 516 becomes ON in case the terminal voltage Vo of the capacitor 216 is higher than the reference voltage. Further, in case the terminal voltage Vo of the capacitor 216 is lower than the reference voltage, the high-speed switch 516 becomes OFF. The high-speed switch 516 may be connected with the resistor 212 in parallel and the low-speed switch 512 in series.

Here, in case the low-speed switch 512 and the high-speed switch 516 are ON, the partial current IL which is a part of the output current of the current outputting unit 302 passes through the resistor 514 and the parallel load unit 304 consumes the partial current IL. Further, for example, in case the high-speed switch 516 becomes ON, the parallel load unit 304 stop consuming the partial current IL. By this, in case the terminal voltage Vo is reduced, the current consuming unit 306 increases the current passing through the resistor 212. Thus, the current consuming unit 306 raises the terminal voltage $V_o$. Therefore, according to the present example, it is possible to hold the power supply current of the electronic device 50 stably.

In addition, for example, if the output current of the current consuming unit 302 is provided to the electronic device 50 without use of the current consuming unit 306, sometimes the terminal voltage Vo of the capacitor 216 remarkably varies according to the variation in the power supply current $I_o$ of the electronic device 50. For example, in case the power supply current $I_o$ increases temporarily, sometimes the terminal voltage Vo decreases remarkably and temporarily by undershooting. Further, in case the power supply current $I_o$ decreases temporarily, sometimes the terminal voltage Vo increases remarkably and temporarily by overshooting. In this case, sometimes the power supply voltage of the electronic device 50 becomes unstable and it is difficult to perform a testing properly. Further, for example, a gate withstanding voltage of the MOSFET is reduced due to recent development of a miniaturizing technique and sometimes the overshoot of the power supply voltage is brought up.

However, according to the present example, it is possible to vary properly the current flowing from the current outputting unit 302 to the capacitor 216 according to the variation in the power supply current $I_o$ of the electronic device 50 by using the current consuming unit 306. Further, thus, it is possible to hold the power supply voltage of the electronic device 50 stably.

Further, since the testing apparatus requires a number of connecting lines 206, sometimes it is difficult to make wire width of the connecting lines 206 large, for example, due to limitation of mounting. Further, it is also difficult to dispose the current outputting unit 302 near the electronic device 50. In this case, even though the output voltage of the current outputting unit 302 is corrected, for example, by feeding the terminal voltage Vo of the capacitor 216 back, there is a limitation of the response speed of the current outputting unit 302, for example, on the basis of an inductance of the connecting line 206. However, according to the present example, it is possible to vary the current received by the capacitor 216 properly at a high speed by switching ON and OFF of the high-speed switch 516.

Further, sometimes the power supply voltage of the electronic device 50 is different according to a test item and a kind of the electronic device 50. In this case, it is required to vary a reference voltage applied to the comparing unit 414 so as to follow the power supply voltage of the electronic device 50. Here, if the reference voltage is to be input to a device power supply other than the current outputting unit 302, sometimes it is difficult to secure sufficient accuracy, for example, due to an error generated between the testing apparatus and the user interface. Further, the circuit is enlarged if a correction circuit for correcting the error is additionally provided.

However, according to the present example, the reference voltage outputting unit 406 generates a reference voltage on the basis of the output voltage of the current outputting unit 302. Thus, according to the present example, it is possible to generate properly the reference voltage even in case the power supply voltage of the electronic device 50 is varied.

Further, according to the present example, the difference detecting unit 412 receives the output voltage of the current outputting unit 302 via the low-pass filter 402. In this case, it is possible to generate the reference voltage stably, for example, even in case the potential Vi of the end of power supply side of the resistor 212 is varied temporarily according to variation in the power supply current $I_o$. Here, in case the low-pass filter 402 has a cut-off frequency of substantially two (2) kHz and the potential Vi is varied by substantially 100 mV, the low-pass filter 402 may have a characteristic of, for example, substantially −40 bd in order to make variation in the output substantially one (1) mV.

In this case, for the low-pass filter 402 having the configuration of one RC-stage such as the present example, the frequency of −3 db is 20 Hz and a time constant of RC τ is eight (8) msec. In this case, in case the power supply voltage applied to the electronic device 50 is varied, a settling time for stabilizing the reference voltage with accuracy of substantially 0.1 percent (%) is, for example, substantially 6.9×τ=55 msec and thus has little influence upon the testing time.

Further, in case the power supply current $I_o$ of the electronic device 50 is one Ampere (1 A) and the electrostatic capacity of the capacitor 216 is 30 μF, the terminal voltage Vo of the capacitor 216 is reduced by three (3) mV per 100 nsec. In this case, it is possible to use, for example, an inexpensive versatile comparator, as the comparing unit 414.

Further, according to another example, the parallel load unit 304 may include a plurality of resistors 514 which may be selected, for example, by a switch. In this case, the control unit 110 may select one resistor, for example, according to a kind of the electronic device 50. The low-speed switch 512 and the high-speed switch 516 may be connected with the selected resistor 514. Further, the parallel load unit 304 may include, for example, a constant current circuit instead of the resistor 514.

Figure 5:
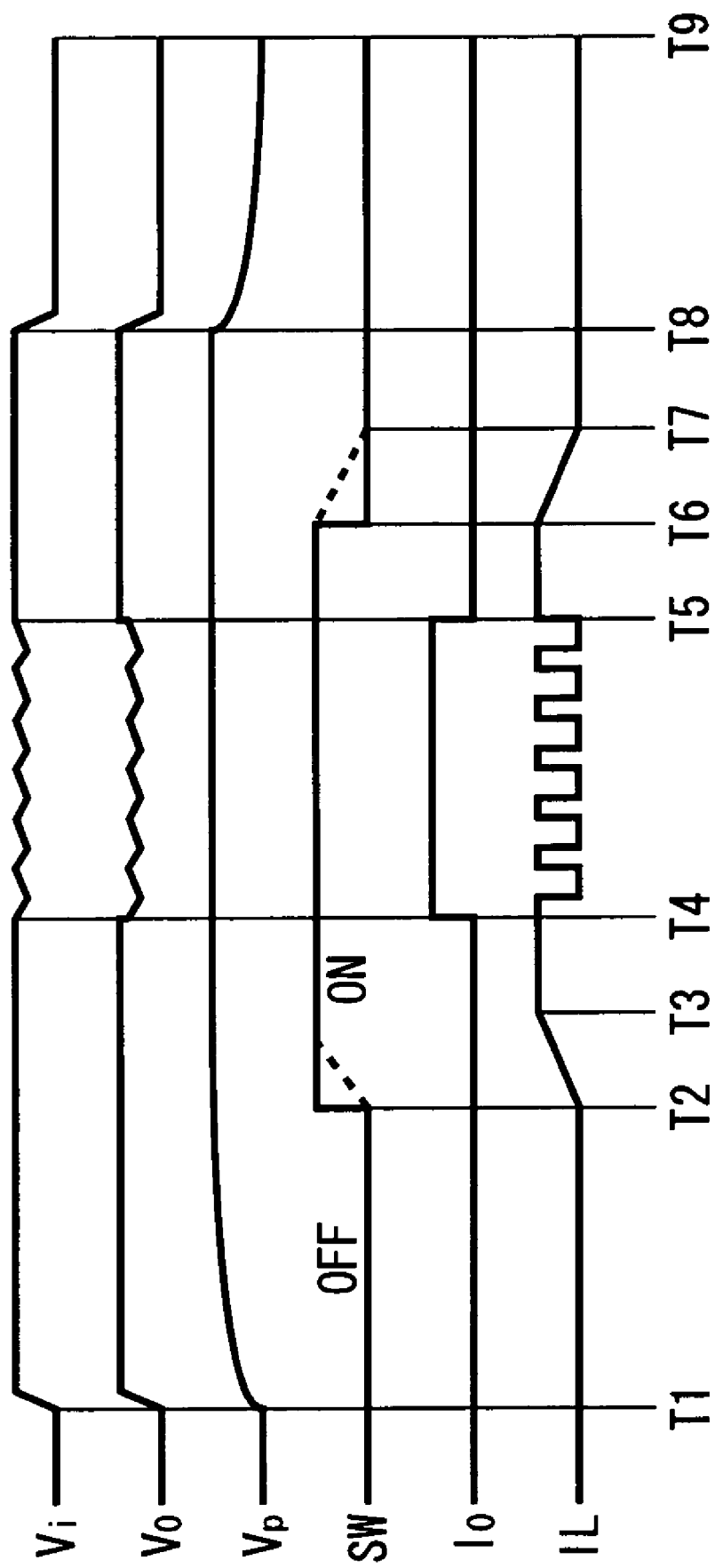
FIG. 5 is a timing chart showing an example of an operation of the current consuming unit 306.

FIG. 5 is a timing chart showing an example of an operation of the current consuming unit 306. According to the present example, the current outputting unit 302 starts to operate at a time T1 and outputs a predetermined voltage. Accordingly, the current consuming unit 306 starts to operate. Then, after the output voltage Vp of the low-pass filter is stabilized, the low-speed switch 512 becomes ON according to variation in the signal SW at a time T2 and the parallel load unit 304 starts to consume the partial current IL. The low-speed switch 512 may be ON after the output voltage Vp of the low-pass filter 402 and the output voltage of the current outputting unit 302 are substantially equal.

Further, the low-speed switch 512 receives the signal SW, for example, via a resistor, and thus may become ON gradually as shown by a doted line in the figure. The parallel load unit 304 may increase the partial current IL gradually from the time T2 to T3.

Then, if the testing on the electronic device 50 is started after a stabilizing time of the low-speed switch 512 is up to a time T4, the terminal voltage Vo of the capacitor 216 varies according to the operation of the electronic device 50. Thus, the high-speed switch 516 becomes ON or OFF according to the variation of the terminal voltage Vo and the parallel load unit 304 consumes the partial current IL which corresponds to that. By this, the current consuming unit 306 stabilizes the power supply voltage of the electronic device 50.

Then, after the testing on the electronic device 50 is finished at a time T5, the low-speed switch becomes OFF over a time T6 to T7. After the stabilizing time of the low-speed switch 512 is up to a time T8, the current outputting unit 302 lowers the output voltage to zero (0). After the output voltage Vp of the low-pass filter 402 is lowered accordingly, the current consuming unit 306 finishes its operation at a time T9. Further, after finishing the operation of the current consuming unit 306, the testing apparatus 100 may wait for a stabilizing time of the low-pass filter 402 and then starts a next testing. According to the present example, it is possible to hold the power supply current $I_o$ of the electronic device 50 stably.

Figure 6:
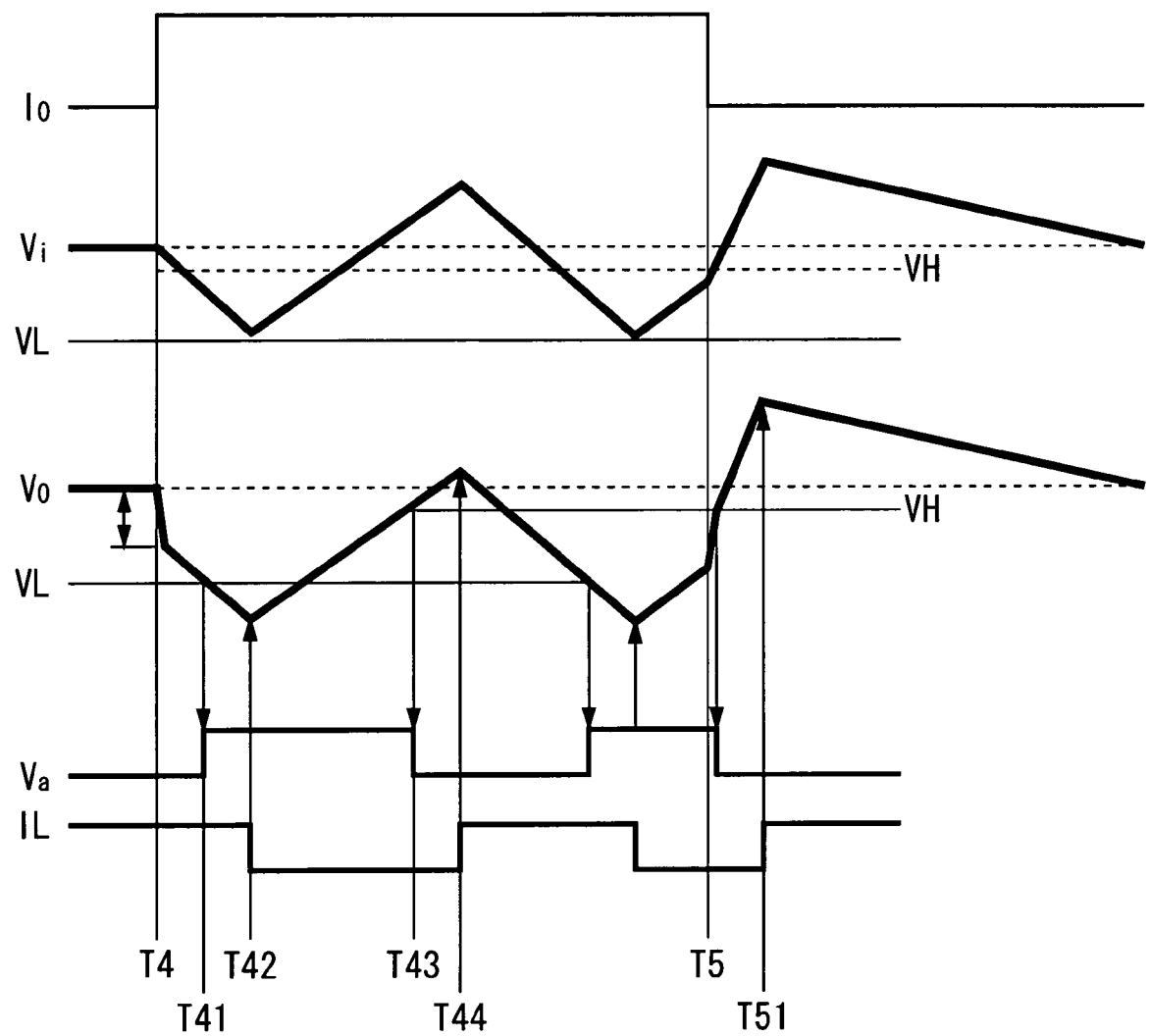
FIG. 6 is a timing chart showing an example of an operation of the current consuming unit 306 in detail.

FIG. 6 is a timing chart showing an example of an operation of the current consuming unit 306 from the time T4 to T5 in detail. During the period, the terminal voltage Vo of the capacitor 216 repeats increase and decrease according to the operation of the electronic device 50, for example.

Here, the reference voltage outputting unit 406 outputs a first reference voltage VH or a second reference voltage VL in response to the output Va of the comparing unit 414. Then, when the terminal voltage Vo is lower than the second reference voltage VL, for example, at a time T41, the comparing unit 414 reverses the output Va to the H-signal. Then, at a time T42 delayed from the time T41 just a little, the parallel load unit 304 stops consuming the partial current IL in response to the output of the load driving unit 410. In this case, the current flowing from the current outputting unit 302 to the capacitor 216 increases and the terminal voltage Vo of the capacitor 216 rises.

In this case, for example, until the terminal voltage Vo becomes higher than the first reference voltage VH after being lower than the second reference voltage VL, the parallel load unit 304 may stop the partial current IL from flowing through the path parallel to the resistor 212. The parallel load unit 304 may stop receiving the partial current IL from the current outputting unit 302 in case the potential difference detected by the difference detecting unit 412 is larger than a predetermined value.

Further, when the terminal voltage Vo is higher than the first reference voltage VH, for example, at a time T43, the comparing unit 414 reverses the output Va to the L-signal. Then, at a time T44 delayed from the time T43 just a little, the parallel load unit 304 starts consuming the partial current IL in response to the output of the load driving unit 410. In this case, the current flowing from the current outputting unit 302 to the capacitor 216 decreases and the terminal voltage Vo of the capacitor 216 falls.

In this case, until the terminal voltage Vo of the capacitor 216 becomes lower than the second reference voltage VL after being higher than the first reference voltage VH, the parallel load unit 304 may consume the partial current IL by making it flow through the path parallel to the resistor 212, on the basis of the output of the comparing unit 414. The parallel load unit 304 may consume the partial current IL in case the potential difference detected by the difference detecting unit 412 is smaller than a predetermined value.

Thus, the current consuming unit 306 stabilizes the terminal voltage Vo of the capacitor 216 to be within a proper range. Therefore, according to the present example, it is possible to hold the power supply voltage of the electronic device 50 stably.

Further, even in case the terminal voltage Vo rises after the testing is finished at the time T5, for example, at a time T51, the parallel load unit 304 starts consuming the partial current IL. By this, it is possible to prevent the terminal voltage Vo from rising excessively.

Figure 7:
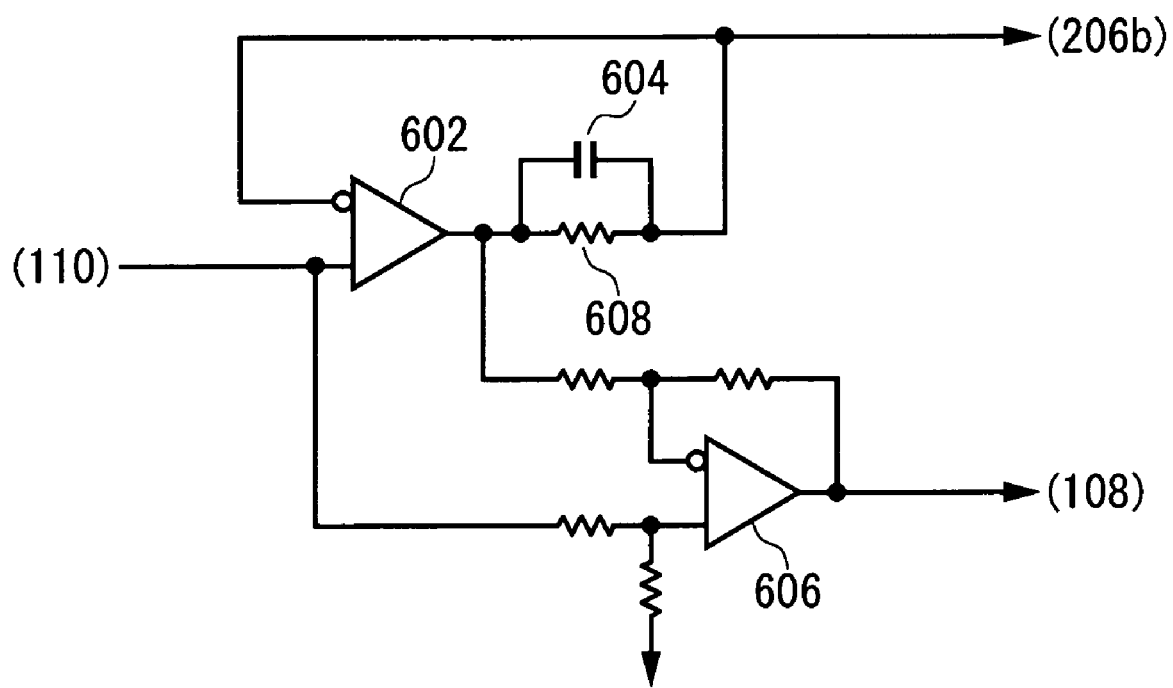
FIG. 7 shows an example of the configuration of a power supply for static current measurement 204.

FIG. 7 shows an example of the configuration of the power supply for static current measurement 204. According to the present example, the power supply for static current measurement 204 includes an operational amplifier 602, a capacitor 604, an operational amplifier 606, and a plurality of resistors.

The operational amplifier 602 provides negative feedback via the resistor 608 and outputs an output voltage according to a voltage received from the control unit 110 as a positive input to the connecting line 206b via the resistor 608. By this, the operational amplifier 602 outputs a voltage on the basis of an instruction of the control unit 110. The capacitor 604 is connected with the resistor 608 in series and thus prevents oscillation of the operational amplifier 602.

A differential amplifier (s subtraction circuit) consists of the operational amplifier 606 and the plurality of resistors. The operational amplifier 606 receives the voltage applied to the operational amplifier 602 by the control unit 110 through a positive input via a resistor and the output of the operational amplifier 602 through a negative input via a resistor. Then, the operational amplifier 606 informs the determining unit 108 of a difference of the voltages received through the positive and the negative inputs.

Here, the potential of the negative input of the operation amplifier 602 providing negative feedback is the same as the potential received through the positive input from the control unit 110. Thus, a current, which is proportional to a difference between the voltage applied to the operational amplifier 602 by the control unit 110 and the output voltage of the operational amplifier 602, flows through the resistor 608. Thus, the power supply for the static current measurement 204 outputs an output current proportional to the difference to the connecting line 206b.

Further, according to the present example, the operational amplifier 606 informs the determining unit 108 of the difference and thus the determining unit 108 can acquire the output current of the power supply for the static current measurement 204 on the basis of the difference and the electric resistance of the resistor 608.

Figure 8:
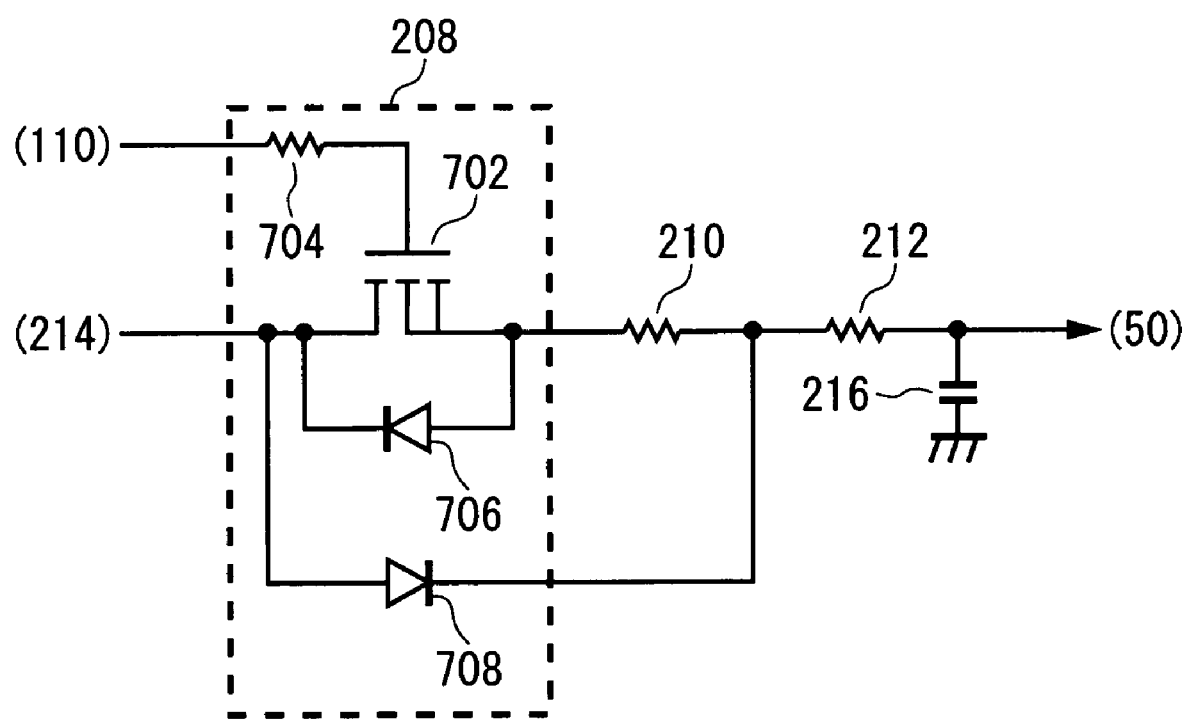
FIG. 8 shows an example of the configuration of a switch 208.

FIG. 8 shows an example of the configuration of the switch 208. According to the present example, the switch 208 includes a MOSFET 702, a resistor 704, and a plurality of diodes 706 and 708. The MOSFET 702 has a drain terminal and a source terminal connected with the capacitor 214 and the resistor 210, respectively. In case of being ON, the MOSFET 702 applies a current received from the capacitor 214 to the capacitor 216 via the resistors 210 and 212. Further, a gate terminal of the MOSFET 702 is connected with the control unit 110 via the resistor 704. Thus, it is possible to make the MOSFET 702 ON or OFF at a proper speed in response to an instruction of the control unit 110. In addition, it is possible to prevent spike-like noise from being generated, for example, in the terminal voltage Vo of the capacitor 216.

Here, for example, in case a gate capacity of the MOSFET 702 is 4000 pF and the electric resistance of the resistor 704 is 100 Ω, a time constant τ of a RC circuit formed by the gate capacity and the electric resistance of the resistor 704 is substantially 0.4 μsec. Further, in case a settling time is supposed to be substantially 10τ, the switch 208 is switched between ON and OFF for four (4) μsec.

Further, the MOSFET 702 is an example of a MOS transistor which is electrically connected with the capacitors 214 and 216 in case of being ON. Further, the resistor 704 is a gate resistor of which one end is electrically connected with the gate terminal of the MOSFET 702 and the other end receives a control signal for controlling the resistor 704.

The diode 706 is connected between the source terminal and the source terminal of the MOSFET 702 in a direction reverse to the direction from the capacitor 214 to the capacitor 216. Thus, the diode 706 discharges the capacitor 216 promptly, for example, in case the current outputting unit 302 (see FIG. 2) lowers the output voltage.

Further, the diode 708 is connected between the capacitor 214 and the resistor 212 in parallel to the MOSFET 702 and the resistor 210 in the direction from the capacitor 214 to the capacitor 216. Thus, for example, in case a voltage across the resistor 210 is higher than a threshold value of the diode 708, the diode 708 makes a current flow from the capacitor 214 to the capacitor 216 regardless of a state of the MOSFET 702. Thus, the diode 708 prevents the terminal voltage Vo of the capacitor 216 from being excessively lowered. According to the present example, it is possible to properly connect the current outputting unit 302 and the capacitor 216. The diode 708 may be a Schottky diode, for example. Further, as described with respect to FIG. 3, a constitution of measuring the power supply current $I_o$ before the static current may omit, for example, the diode 708.

Figure 9:
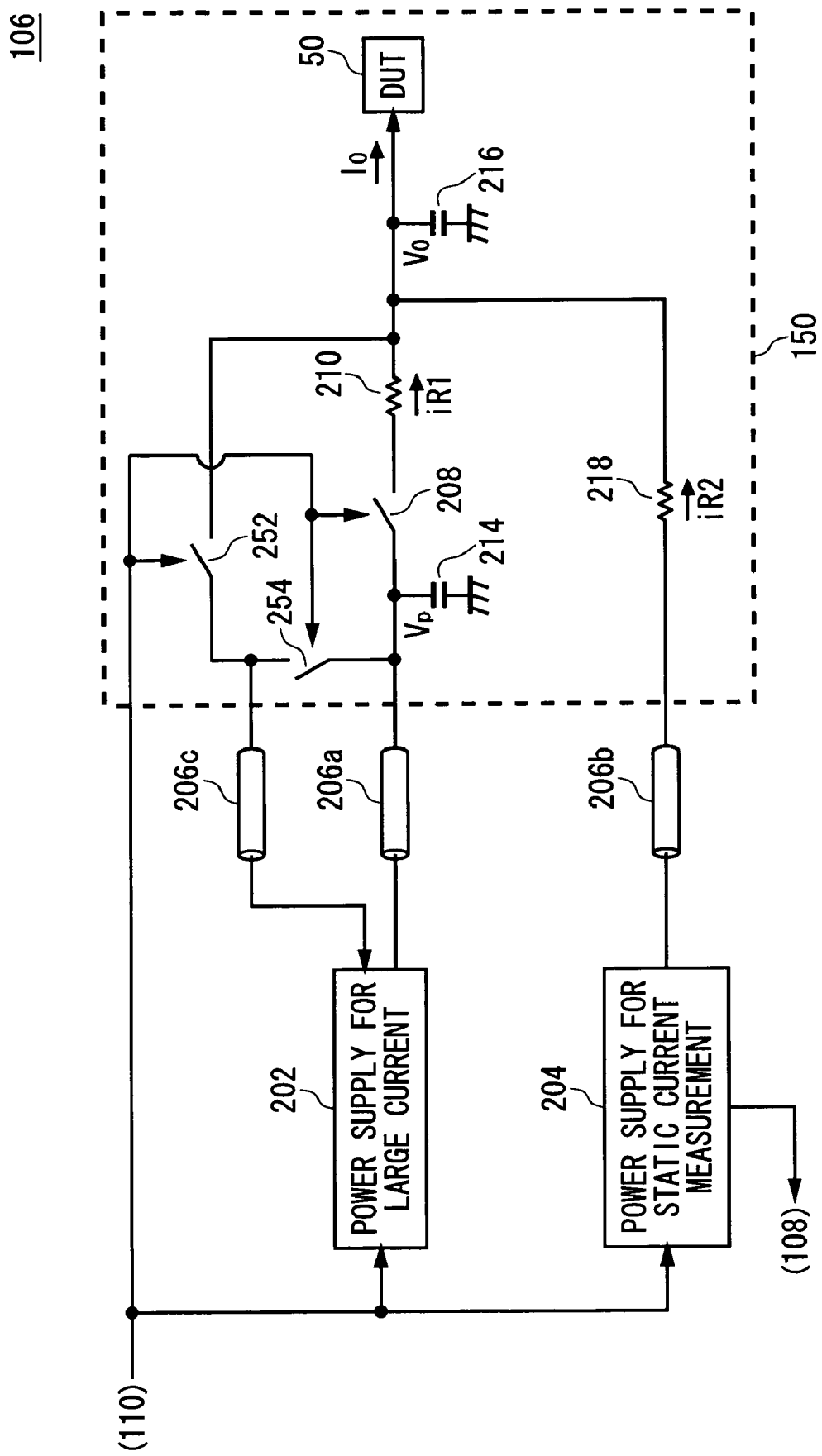
FIG. 9 shows another example of the configuration of the power supply unit 106.

FIG. 9 shows another example of the configuration of the power supply unit 106 along with the electronic device 50. According to the present example, the power supply unit 106 includes the power supply for large current 202, the power supply for static current measurement 204, a plurality of connecting lines 206a to 206c, the plurality of capacitors 214 and 216, a plurality of switches 208, 252, and 254, the plurality of resistors 210 and 218. Further, with the exception of the following, description is omitted on elements instructed by the same reference numerals in FIG. 9 as those of FIG. 2 because the elements have the same configurations and functions as those of FIG. 2.

In case of being ON, the switch 254 electrically connects the capacitor 214 and the power supply for large current 202 via the connecting line 206c. In case of being ON, the switch 252 electrically connects the capacitor 216 and the power supply for large current 202 via the connecting line 206c. The switches 252 and 254 may be ON or OFF in response to an instruction of the control unit 110.

The power supply for large current 202 receives the terminal voltage Vp of the capacitor 216 or the terminal voltage Vo of the capacitor 214 via the switch 252 or 254 and varies the output current accordingly. In this case, the power supply for large current 202 can output the output current with high accuracy. Further, according to the present example, it is also possible to acquire the power supply current $I_o$ on the basis of the second current iR2 output by the power supply for static current measurement 204 with high accuracy. Thus, according to the present example, it is possible to test the electronic device 50 with high accuracy.

Figure 10:
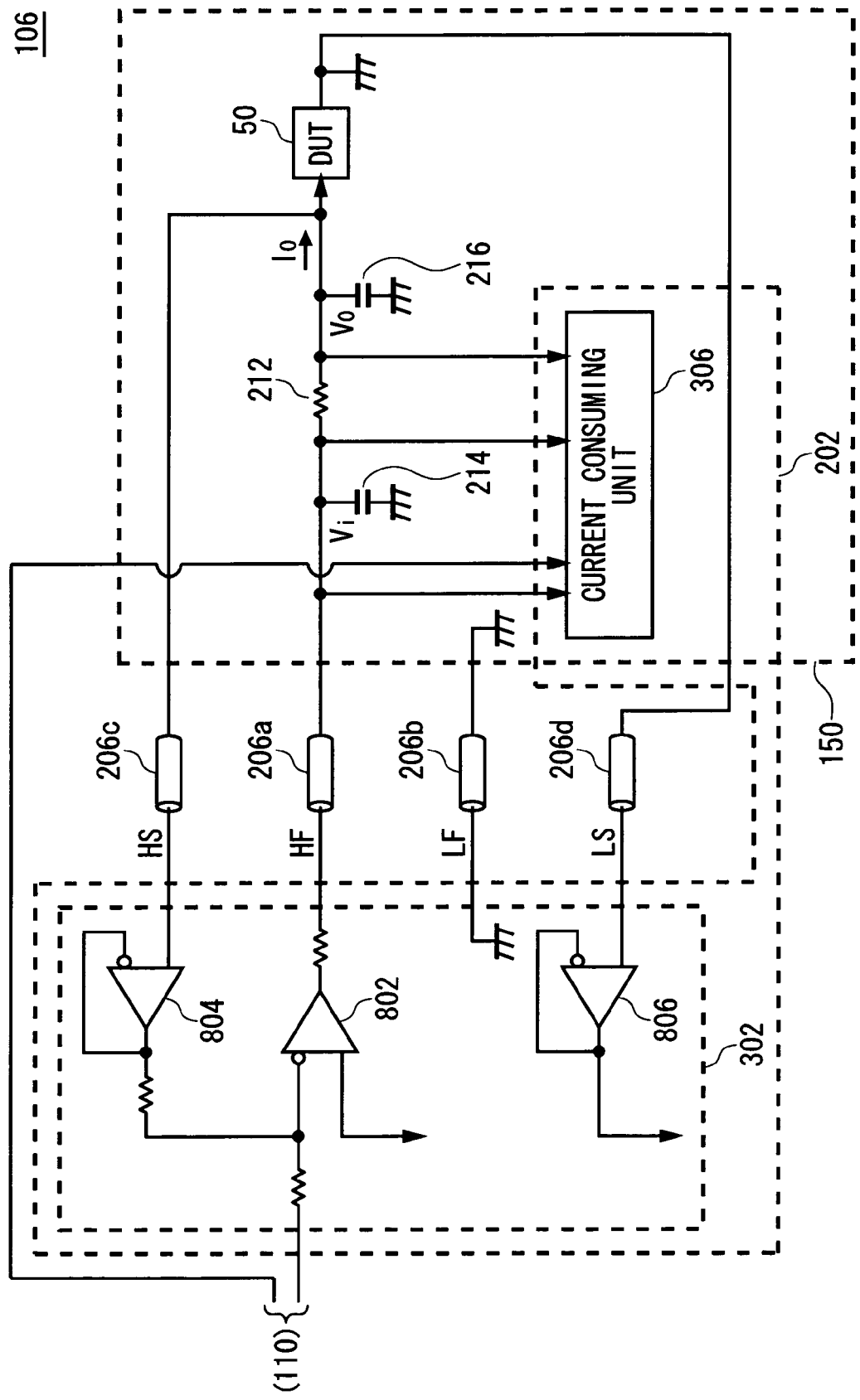
FIG. 10 shows another example of the configuration of the power supply unit 106.

FIG. 10 shows another example of the configuration of the power supply unit 106 along with the electronic device 50. According to the present example, the power supply unit 106 includes the power supply unit for large current 202, a plurality of connecting lines 206a to 206d, the plurality of capacitors 214 and 216, and the resistor 212. Further, with the exception of the following, description is omitted on elements instructed by the same reference numerals in FIG. 10 as those of FIG. 2 because the elements have the same configurations and functions as those of FIG. 2.

According to the present example, the connecting line 206b electrically connects a ground terminal of the current outputting unit 302 and a ground terminal of the user interface 150. Thus, the current outputting unit 302 and the user interface 150 are grounded in common with high accuracy. Further, the connecting line 206c electrically connects one end of the capacitor 216 and the current outputting unit 302. The connecting line 206 electrically connects a ground terminal of the electronic device 50 and the current outputting unit 302.

The current outputting unit 302 includes a plurality of voltage followers 804 and 806, an operational amplifier 802, and a plurality of resistors. The voltage follower 804 is connected with the capacitor 216 via the connecting line 206c and applies a voltage equal to the terminal voltage Vo of the capacitor 216 to a negative input of the operational amplifier 802. The voltage follower 806 is connected with the ground terminal of the electronic device 50 via the connecting line 206d and applies a voltage equal to a voltage generated at the ground terminal of the electronic device 50 to a positive input of the operational amplifier 802.

The operational amplifier 802 receives the voltage output by the control unit 110 from the positive input via a resistor and outputs a corresponding voltage to the connecting line 206a via a resistor. Here, the operational amplifier 802 receives the terminal voltage Vo generated in the capacitor 216 according to the output current and the voltage of the ground terminal of the electronic device 50 via the voltage followers 804 and 806 and thus is subject to feedback control. Thus, according to the present example, it is possible to control the output voltage of the operational amplifier 802 with high accuracy. Further, according to the present example, it is possible to hold the terminal voltage Vo of the capacitor 216 stably by the current consuming unit 306. Therefore, according to the present example, it is possible to test the electronic device 50 with high accuracy.

Figure 11:
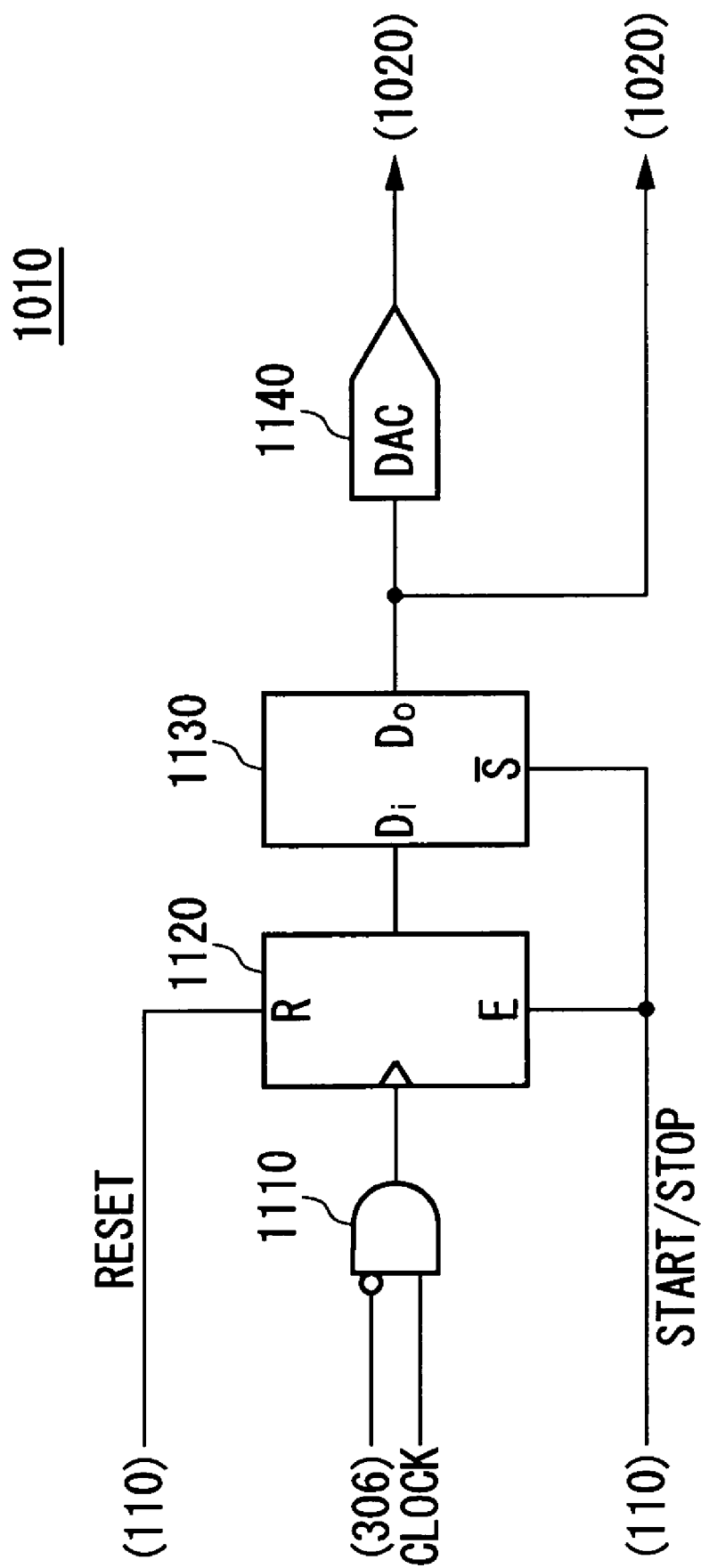
FIG. 11 shows the configuration of a time measuring unit 1010.

FIG. 11 shows the configuration of the time measuring unit 1010. The time measuring unit 1010 according to the present embodiment measures an OFF time when the high-speed switch 516 becomes OFF during a measuring time of an average current consumption of the electronic device 50 and thus measures a time during which the current consuming unit 306 stops consumption of the partial current IL.

The time measuring unit 1010 includes a logic circuit 1110, a counter 1120, a register 1130, and a DA converter 1140. The logic circuit 1110 provides the counter 1120 with a clock signal such as a reference clock of the testing apparatus 100 while the high-speed switch is OFF. More specifically, the logic circuit 1110 outputs an AND between an inverted value of the signal output by the load driving unit 410 in the current consuming unit 306 and the clock signal. Thus, the logic circuit 1110 provides the counter 1120 with the clock signal while the load driving unit 410 outputs the L-signal, that is, the high-speed switch is OFF.

The counter 1120 counts a time during which the high-speed switch 516 is OFF on the basis of the clock signal provided from the logic circuit 1110 while the high-speed switch 516 is OFF. More specifically, the control unit 110 inputs a reset signal to the counter 1120 before the measuring time starts. The counter 1120 receiving it initializes a counting value. Then, the control unit 110 provides a start/stop signal with H-logic during the measuring time. The counter 1120 receiving it enables count and counts the clock signal provided from the logic circuit 1110. Then, when the measuring time ends, the control unit 110 makes the start/stop signal L-logic. The counter 1120 receives it and stops counting.

The counting value output by the counter 1120 is input to the counter 1130 as a data input signal Di. The counter 1130 stores the counting value when the measuring time ends and outputs it as a data output signal Do. More specifically, the register 1130 stores the counting value when the measuring time ends and the start/stop signal is varied from H-logic to L-logic. Here, the register 1130 may store only the most significant bit(s) of the counting value output by the counter 1120 and output it as the data output signal Do.

The DA converter 1140 converts the OFF time of the high-speed switch 516, which is counted by the counter 1120 and stored in the register 1130 in cycles, to an analog signal.

In the above, the control unit 110 sets the measuring time so that the clock signal has a cycle which is n power of 2 (here, n is a positive integer). By this, the counter 1120 counts the off time of the high-speed switch 516 during the measuring time per a cycle obtained by dividing the measuring time by n power of 2. By setting the measuring time like this, if it is supposed that n th bit from the final figure of the counting value is a number of one (1) cipher and bit of n-1 th or lower than n-1 th is decimal fraction, the counting value can be used as a ratio of the OFF time of the high-speed switch 516 to the measuring time.

Further, if the logic circuit 1110 is a logic circuit outputting an AND between the signal output by the load driving unit 410 and the clock signal (an AND logic), the logic circuit 1110 can measure an ON time of the high-speed switch 516 instead of the OFF time of the high-speed switch 516.

Figure 12:
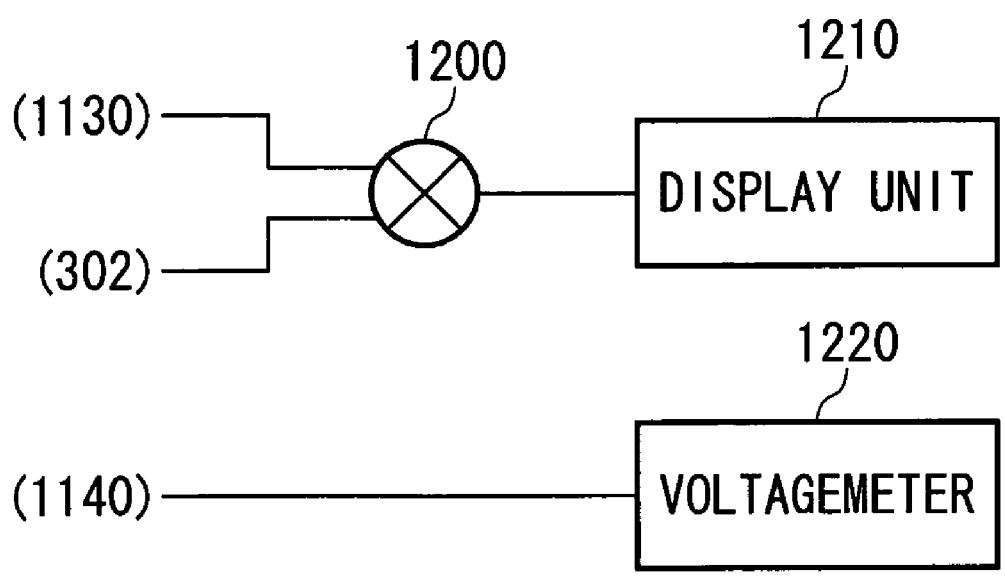
FIG. 12 shows an example of the configuration of a current consumption acquiring unit 1020.

FIG. 12 shows an example of the configuration of the current consumption acquiring unit 1020. The current consumption acquiring unit 1020 acquires and displays an average current consumption of the electronic device 50 during the measuring time of the function test on the basis of the ON time or the OFF time of the high-speed switch 516 measured by the time measuring unit 1010 and a current value of the output current of the current outputting unit 302. The current consumption acquiring unit 1020 according to the present example can be used in case the parallel load unit 304 consumes the partial current IL as much as the output current of the current outputting unit 302 when the high-speed switch 516 is ON.

The current consumption acquiring unit 1020 according to the present example multiplies an average value of the output current of the current outputting unit 302 during the measuring time by a ratio of the OFF time of the high-speed switch 516 to the measuring time and thus acquires an average current consumption. The current consumption acquiring unit 1020 includes a multiplying unit 1200, a display unit 1210, and a voltage meter 1220.

The average value of the output current of the current outputting unit 302 during the measuring time is input to the multiplying unit 1200 from the current outputting unit 302. Further, the counting value of the counter 1120 is input to the multiplying unit 1200 via the register 1130. Then, the multiplying unit 1200 multiplies the average value of the output current during the measuring time by the counting value of the counter 1120 showing the ratio of the OFF time of the high-speed switch 516 to the measuring time and thus acquires the average current consumption of the electronic device 50. The display unit 1210 displays the average current consumption of the electronic device 50 acquired by the multiplying unit 1200.

The voltage meter 1220 measures and displays a voltage of an analog signal output by the DA converter 140. Here, a user of the current consumption measuring unit 1000 reads the output voltage of the DA converter 1140 and acquires a ratio of the output voltage to an output voltage of the DA converter 1140 corresponding to the maximum counting value (n power of 2) during the measuring time. In addition, if the average value of the output current of the current outputting unit 302 is retrieved, it is possible to acquire an average current consumption of the electronic device 50 on the basis of those values in a similar way with the multiplying unit 1200. Here, since the DA converter 1140 and the voltage meter 1220 may be connected by one analog signal, it is possible to embody the voltage meter 1220 more easily compared with wiring of a digital signal.

Figure 13:
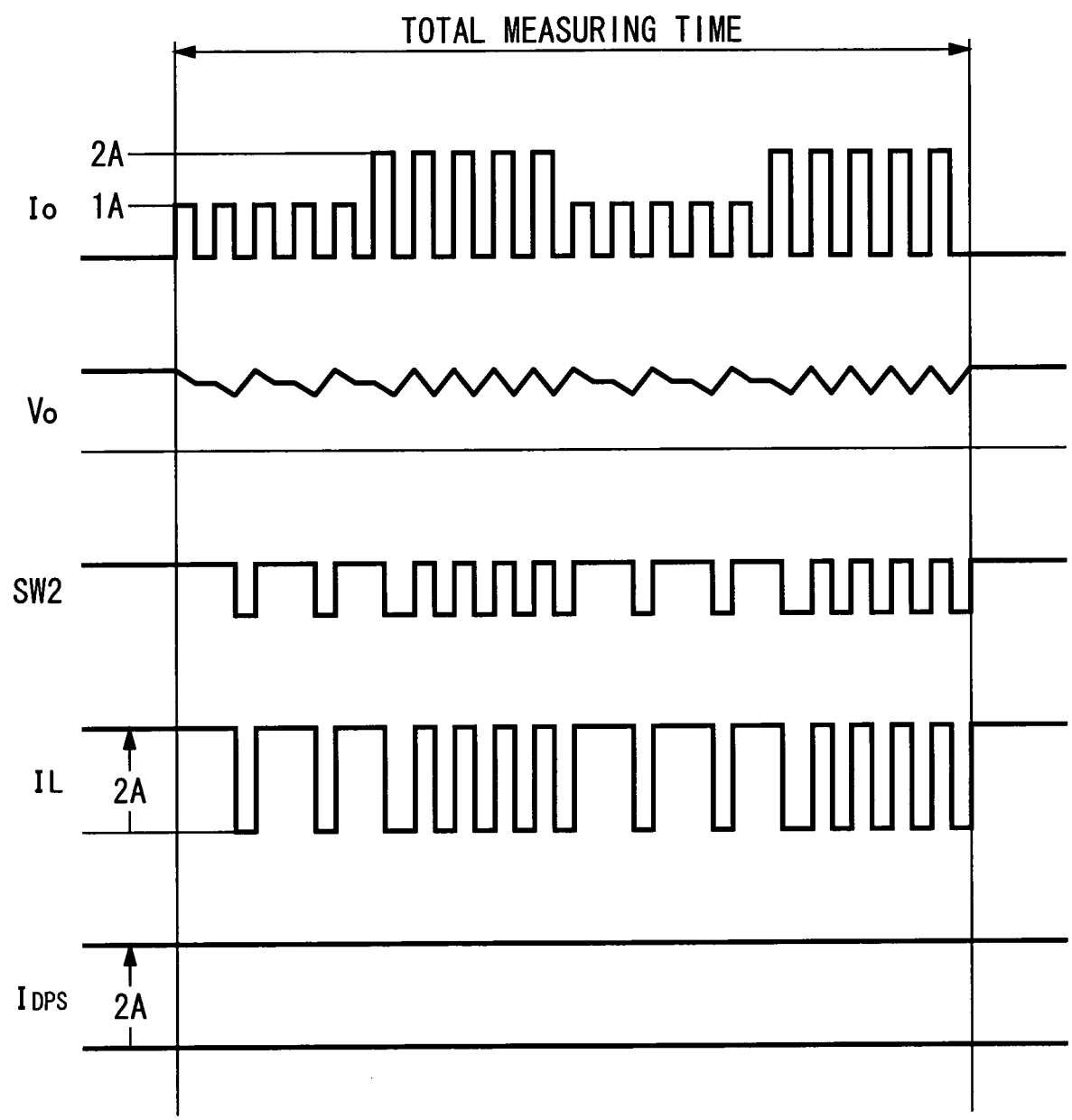
FIG. 13 is a timing chart showing an example of an operation of the current consuming unit 306 during a measuring time.

FIG. 13 shows an example of an operation of the current consuming unit 306 during the measuring time in case of measuring the average current consumption of the electronic device 50 by using the time measuring unit 1010 and the current consumption acquiring unit 1020 shown in the FIGS. 11 and 12. According to the present example, the parallel load unit 304 consumes the partial current as much as an output current IDPS of the current consuming unit 302 when the high-speed switch 516 is in an ON-state. The state may be resulted in case the current consumption is substantially 0A when the electronic device 50 does not operate.

The electronic device 50 operates according to the function test during the measuring time. As a result, the power supply current $I_o$ input to the electronic device 50 varies between 0A, 1A, and 2A as shown in FIG. 13 and the terminal voltage Vo of the capacitor 216 varies according to the operation of the electronic device 50. Then, an output SW2 of the load driving unit 410 is switched so as to suppress the variation in the terminal voltage Vo. As a result, the high-speed switch 516 is properly switched to ON or OFF so as to suppress the variation in the terminal voltage Vo.

When the high-speed switch 516 is ON, the partial current IL becomes the same value as the output current IDPS (2A in the present example). In the meantime, when the high-speed switch 516 is OFF, the partial current IL becomes 0A. Therefore, the average value of the power supply current $I_o$ of the electronic device 50, that is, the average current consumption of the electronic device 50 can be acquired by the equation (1) as follows:

$$\text{Average value of } I_o = \text{Average value of } I_{DPS} \times (\text{OFF time of the high-speed switch 516/measuring time}) \quad (1).$$

Therefore, the current consumption acquiring unit 1020 multiplies the average value of the output current IDPS during the measuring time by the ratio of the OFF time of the high-speed switch 516 to the measuring time and thus can acquire the average current consumption of the electronic device 50. Further, the user of the testing apparatus 1000 can acquire the average current consumption of the electronic device 50 by reading the average value of the output current IDPS from the current outputting unit 302 and the ratio of the OFF time of the high-speed switch 516 from the voltage meter 1220.

Figure 14:
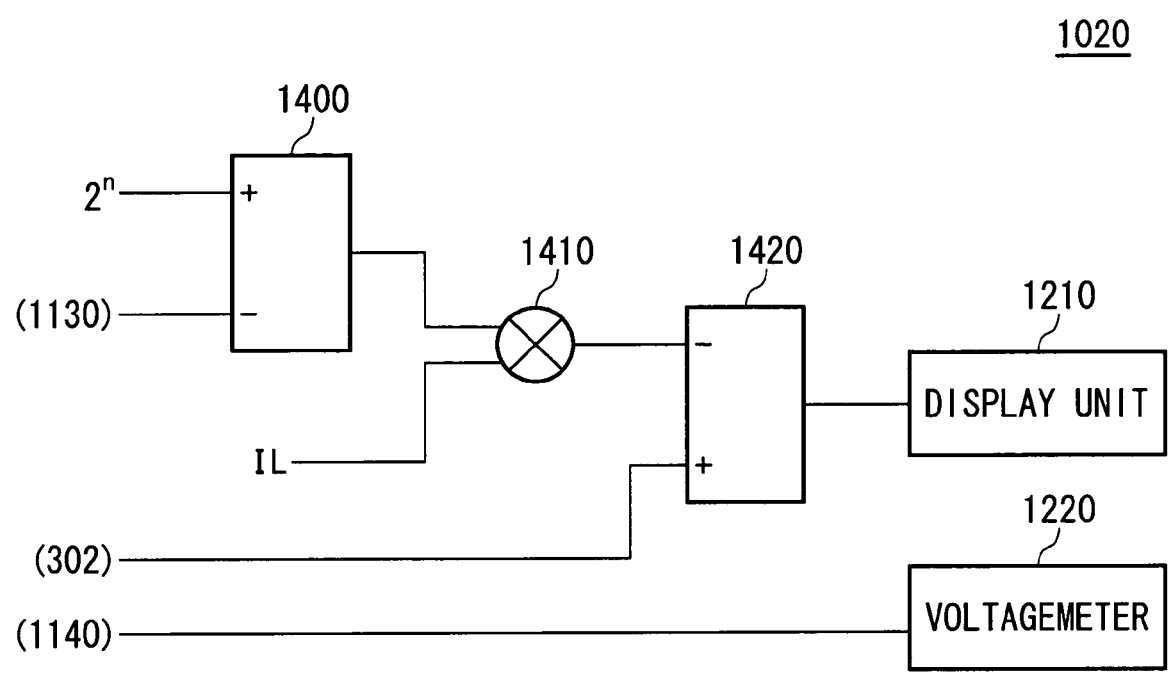
FIG. 14 shows another example of the configuration of the current consumption acquiring unit 1020.

FIG. 14 shows another example of the configuration of the current consumption acquiring unit 1020. The current consumption acquiring unit 1020 according to the present example acquires and displays the average current consumption of the electronic device 50 during the measuring time of the function test on the basis of the ON or OFF time of the high-speed switch 516 measured by the time measuring unit 1010, the current value of the output current, and the current value of the partial current of the parallel load unit 304 when the high-speed switch 516 is ON. The current consumption acquiring unit 1020 according to the present example can be used in case the parallel load unit 304 consumes the partial current IL different from the output current of the current outputting unit 302 when the high-speed switch 516 is ON.

The current consumption acquiring unit 1020 according to the present example acquires an average current consumption by subtracting the product of the current value of the partial current when the high-speed switch 516 is ON and the ratio of the ON time to the measuring time from the average value of the output current during the measuring time. The current consumption acquiring unit 1020 according to the present example includes a subtracting unit 1400, a multiplying unit 1410, a subtracting unit 1420, a display unit 1210, and a voltage meter 1220. Here, description on the display unit 1210 and the voltage meter 1220 is omitted because they have the same functions and configurations as those of the display unit 1210 and the voltage meter 1220 shown in FIG. 12.

The subtracting unit 1400 acquires the ON time of the high-speed switch 516 by subtracting the OFF time of the high-speed switch 516 from the measuring time. More specifically, the subtracting unit 1400 acquires a cycle number in case the high-speed switch 516 is ON by subtracting a cycle number in case the high-speed switch 516 is OFF, that is, the counting value provided via the register 1130, from the n power of 2 which is the cycle number of the measuring time. Here, an output of the subtracting unit 1400 can also be used as a ratio of the ON time of the high-speed switch 516 to the measuring time.

The multiplying unit 1410 multiplies the current value of the partial current IL when the high-speed switch 516 is ON by the ratio of the ON time of the high-speed switch 516 to the measuring time output by the subtracting unit 1400. The subtracting unit 1420 subtracts the product output by the multiplying unit 1410 from the average value of the output current IDPS of the current outputting unit 302 during the measuring time.

Figure 15:
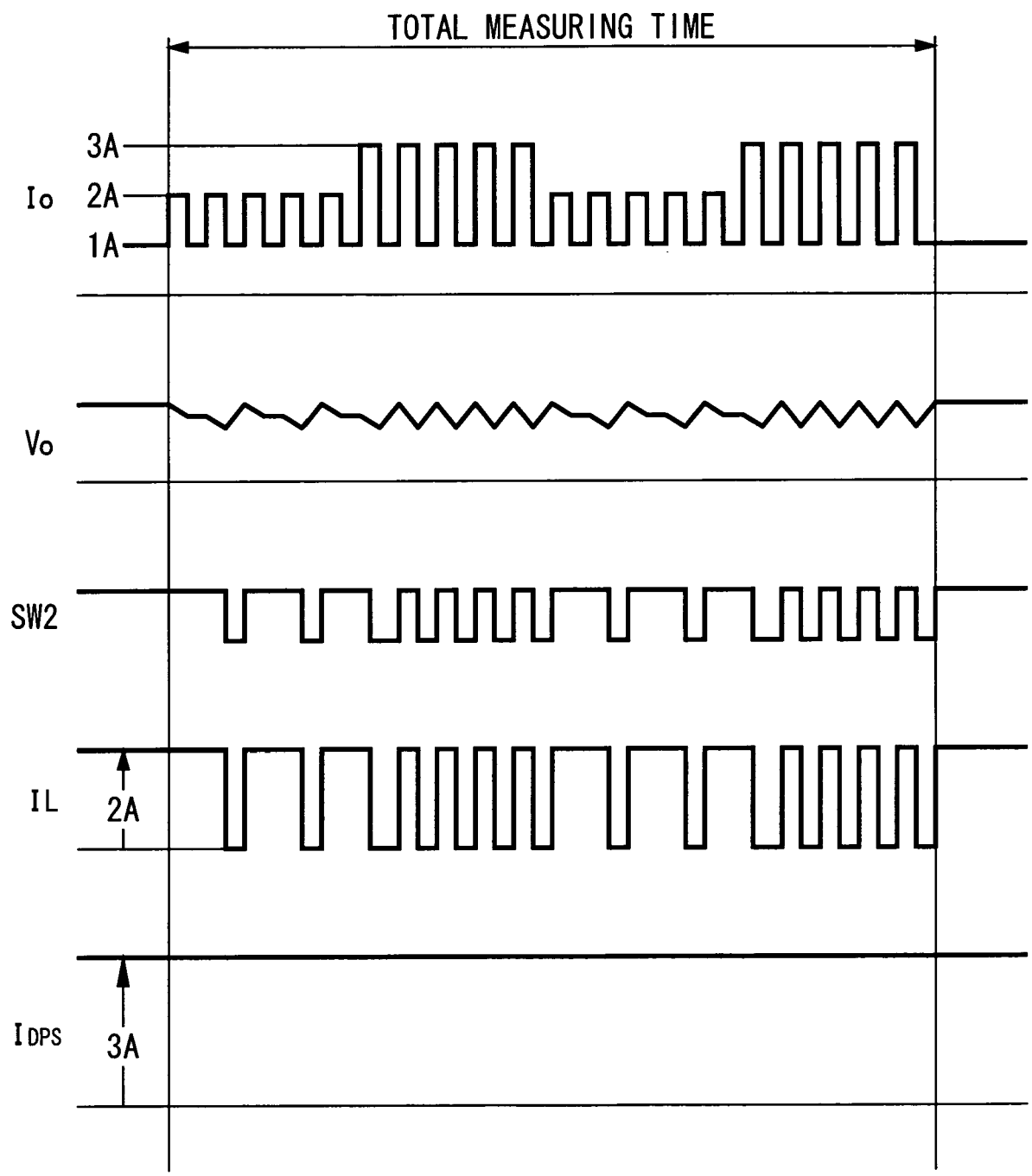
FIG. 15 is a timing chart showing another example of an operation of the current consuming unit 306 during a measuring time.

FIG. 15 shows another example of an operation of the current consuming unit 306 during the measuring time in case of measuring the average current consumption of the electronic device 50 by using the time measuring unit 1010 and the current consumption acquiring unit 1020 shown in FIGS. 11 and 13. According to the present example, the parallel load unit 304 consumes the partial current IL less than the output current IDPS of the current outputting unit 302 when the high-speed switch 516 is in an ON-state. The state may be resulted in case the current consumption does not become 0 A even if the electronic device 50 does not operate.

The electronic device 50 operates according to the function test during the measuring time. As a result, the power supply current $I_o$ input to the electronic device 50 varies between 0A, 1A, 2A, and 3A as shown in FIG. 15 and the terminal voltage Vo of the capacitor 216 varies according to the operation of the electronic device 50. Then, the output SW2 of the load driving unit 410 is switched so as to suppress the variation in the terminal voltage Vo. As a result, the high-speed switch 516 is properly switched to ON or OFF so as to suppress the variation in the terminal voltage Vo.

When the high-speed switch 516 is ON, the partial current IL becomes less than the output current IDPS (2A in the present example). In the meantime, when the high-speed switch 516 is OFF, the partial current IL becomes 0 A. Therefore, the average current consumption of the electronic device 50 can be acquired by the equation (1) as follows:

$$\text{Average value of } I_o = \text{Average value of } I_{DPS} - \text{IL of ON time} \times [0144] \qquad (2).$$

Here, since [0146] is (ON time of the high-speed switch 516/measuring time), the current consumption acquiring unit 1020 can acquire an average current assumption of the electronic device 50 by subtracting the product of the current value of the partial current IL when the high-speed switch 516 is ON and the ratio of the ON time to the measuring time from the average value of the output current IDPS during the measuring time. Further, the user of the testing apparatus 1000 reads the average value of the output current IDPS from the current outputting unit 302 and the ratio of the ON time of the high-speed switch 516 from the voltage meter 1220 and thus can also acquire the average current consumption of the electronic device 50 on the basis of the values and the current value of the partial current IL when the high-speed switch 516 is ON.

According to the current consumption measuring unit 1000 described above, it is possible to measure the average current consumption of the electronic device 50 on the basis of the output current of the current outputting unit 302, the ON or OFF time of the high-speed switch 516, and/or the partial current when the high-speed switch 516 is ON, also in case of making properly the high-speed switch 5160N so as to suppress the variation in the power supply voltage of the electronic device 50 during the function testing and the like. Thus, it is possible to properly measure the average current consumption of the electronic device 50 under a condition that a predetermined output current flows from the current outputting unit 302 and the partial current is consumed properly according to the operation of the electronic device 50.

According to the present invention, it is possible to test an electronic device with high accuracy.

Although the present invention has been described by way of exemplary embodiments, it should be understood that those skilled in the art might make many changes and substitutions without departing from the spirit and the scope of the present invention which is defined only by the appended claims.

What is claimed is:

1. A current measuring apparatus for measuring a power supply current received by an electronic device comprising:
    a first current supplying unit for outputting a first current which is a part of the power supply current;
    a capacitor of device side for smoothing the power supply current;
    a smoothing capacitor for smoothing the first current output by said first current supplying unit connected on a path between an output of the first current supplying unit and a point of connection with said capacitor of device side, wherein an electrostatic capacity of said capacitor of device side is smaller than that of said smoothing capacitor and one end of said capacitor of device side is connected with the electronic device;
    a switch for making the first current flow from said smoothing capacitor to said capacitor of device side in case of being ON;
    a second current supplying unit for outputting a second current which is smaller than the first current to said capacitor of device side via a path parallel to said switch, wherein the path parallel to said switch is free of connection to any capacitor between an output of the second current supplying unit and a point of connection with said capacitor of device side; and
    a power supply current acquiring unit for acquiring the power supply current on the basis of the second current output by said second current supplying unit.

2. The current measuring apparatus as claimed in claim 1 further comprising:
    a first resistor for electrically connecting said switch and one end of said capacitor of device side; and
    a second resistor having electric resistance which is larger than that of said first resistor for electrically connecting said second current supplying unit and one end of said capacitor of device side.

3. The current measuring apparatus as claimed in claim 2, wherein said power supply current acquiring unit acquires the power supply current on the basis of the second current output by said second current supplying unit and a ratio of the electric resistance of said first resistor to that of said second resistor in case said switch becomes ON.

4. The current measuring apparatus as claimed in claim 1, wherein said power supply current acquiring unit acquires the second current as the power supply current in case said switch becomes OFF.

5. The current measuring apparatus as claimed in claim 1, wherein said switch comprises:

a MOS transistor for electrically connecting said smoothing capacitor and said capacitor of device side in case of being ON; and a gate resistor of which one end is electrically connected to a gate terminal of said MOS transistor and the other end receives a control signal for controlling said MOS transistor.

6. A current measuring apparatus for measuring a power supply current received by an electronic device comprising:

a first current supplying unit for outputting a first current which is a part of the power supply current;

a capacitor of device side for smoothing the power supply current;

a smoothing capacitor for smoothing the first current output by said first current supplying unit connected on a path between an output of the first current supplying unit and a point of connection with said capacitor of device side, wherein an electrostatic capacity of said capacitor of device side is smaller than that of said smoothing capacitor and one end of said capacitor of device side is connected with the electronic device;

a first resistor for electrically connecting one end of said smoothing capacitor and one end of said capacitor of device side;

a second resistor which has electric resistance which is larger than that of said first resistor and of which one end is electrically connected with one end of said capacitor of device side;

a second current supplying unit for outputting a second current which is smaller than the first current to said capacitor of device side via said second resistor, wherein a path between an output of the second current supplying unit and a point of connection with said capacitor of device side is free of connection to any capacitor; and a power supply current acquiring unit for acquiring the power supply current on the basis the second current output by said second current supplying unit and a ratio of electric resistance of said first resistor to that of said second resistor.

7. A testing apparatus for testing an electronic device comprising:

a first current supplying unit for outputting a first current which is a part of a power supply current to be received by the electronic device;

a capacitor of device side for smoothing the power supply current;

a smoothing capacitor for smoothing the first current output by said first current supplying unit connected on a path between an output of the first current supplying unit and a point of connection with said capacitor of device side, wherein an electrostatic capacity of said capacitor of device side is smaller than that of said smoothing capacitor and one end of said capacitor of device side is connected with the electronic device;

a switch for making the first current flow from said smoothing capacitor to said capacitor of device side in case of being ON;

a second current supplying unit for outputting a second current which is smaller than the first current to said capacitor of device side via a path parallel to said switch, wherein the path parallel to said switch is free of connection to any capacitor between an output of the second current supplying unit and a point of connection with said capacitor of device side; and a determining unit for acquiring the power supply current on the basis of the second current output by said second current supplying unit and determining pass/fail of the electronic device on the basis of the acquired power supply current.

8. A testing apparatus for testing an electronic device comprising:

a first current supplying unit for outputting a first current which is a part of a power supply current to be received by the electronic device;

a capacitor of device side for smoothing the power supply current;

a smoothing capacitor for smoothing the first current output by said first current supplying unit connected on a path between an output of the first current supplying unit and a point of connection with said capacitor of device side, wherein an electrostatic capacity of said capacitor of device side is smaller than that of said smoothing capacitor and one end of said capacitor of device side is connected with the electronic device;

a first resistor for electrically connecting one end of said smoothing capacitor and one end of said capacitor of device side;

a second resistor which has electric resistance which is larger than that of said first resistor and of which one end is electrically connected with one end of said capacitor of device side;

a second current supplying unit for outputting a second current which is smaller than the first current to said capacitor of device side via said second resistor, wherein a path between an output of the second current supplying unit and a point of connection with said capacitor of device side is free of connection to any capacitor; and a determining unit for acquiring the power supply current on the basis of the second current output by said second current supplying unit and a ratio of electric resistance of said first resistor to that of said second resistor and determining pass/fail of the electronic device on the basis of the acquired power supply current.

* * * * *